United States Patent
Kanazawa et al.

(10) Patent No.: US 8,222,651 B2
(45) Date of Patent: Jul. 17, 2012

(54) SEMICONDUCTOR DEVICE

(75) Inventors: Takamitsu Kanazawa, Tokyo (JP);
Toshiyuki Hata, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 174 days.

(21) Appl. No.: 12/776,376

(22) Filed: May 8, 2010

(65) Prior Publication Data

US 2010/0289127 A1   Nov. 18, 2010

(30) Foreign Application Priority Data

May 14, 2009   (JP) ................. 2009-117689

(51) Int. Cl.
*H01L 33/00* (2010.01)
(52) U.S. Cl. .......... 257/88; 257/288; 257/666; 257/735; 257/E21.006; 257/E21.053; 257/E21.352; 257/E21.361; 257/E21.499
(58) Field of Classification Search .............. 257/88, 257/99, 100, 104, 288, 666, 734, 735, E21.006, 257/E21.053, E21.352, E21.361, E21.499
See application file for complete search history.

(56) References Cited

U.S. PATENT DOCUMENTS

| | | | |
|---|---|---|---|
| 6,307,272 B1* | 10/2001 | Takahashi et al. | 257/787 |
| 7,541,672 B2 | 6/2009 | Satou et al. | |
| 2001/0050422 A1* | 12/2001 | Kishimoto et al. | 257/678 |
| 2002/0047187 A1* | 4/2002 | Nakajima et al. | 257/666 |
| 2003/0062608 A1* | 4/2003 | Hamachi | 257/676 |
| 2009/0058500 A1 | 3/2009 | Osawa et al. | |

FOREIGN PATENT DOCUMENTS

| | | |
|---|---|---|
| JP | 2005-26294 A | 1/2005 |
| JP | 2005-243685 A | 9/2005 |
| JP | 2008-166461 A | 7/2008 |

* cited by examiner

*Primary Examiner* — David Nhu
(74) *Attorney, Agent, or Firm* — Miles & Stockbridge P.C.

(57) ABSTRACT

A semiconductor device in which the wiring resistance and parasitic inductance of a semiconductor package configuring a power semiconductor module is reduced. In the semiconductor device, a semiconductor chip with an IGBT formed therein and a diode chip are mounted over the upper surface of a die pad. An emitter pad of the semiconductor chip and an anode pad of the diode chip are coupled with a lead by an Al wire. One end of the lead is located in a higher position than the upper surface of the die pad in order to shorten the length of the Al wire for coupling the emitter pad and the lead.

13 Claims, 40 Drawing Sheets

SEMICONDUCTOR DEVICE

CROSS-REFERENCE TO RELATED APPLICATIONS

The disclosure of Japanese Patent Application No. 2009-117689 filed on May 14, 2009 including the specification, drawings and abstract is incorporated herein by reference in its entirety.

BACKGROUND OF THE INVENTION

The present invention relates to semiconductor devices and more particularly to power semiconductor modules which combine a plurality of semiconductor chips in which power transistors such as IGBTs (Insulated Gate Bipolar Transistors) and MOSFETs are formed.

A power semiconductor module which combines several power semiconductor chips such as transistors and diodes typically includes a metal base plate for diffusing heat generated by semiconductor elements, a wiring layer having a wiring pattern for mounting semiconductor chips, and an insulating substrate for insulation between the wiring layer and the metal base plate.

In recent years, efforts toward more compact power semiconductor modules have been pursued in order to decrease the packaging area and reduce the cost of parts. For example, Japanese Unexamined Patent Publication No. 2008-166461 discloses a bidirectional switch module in which two transistor chips and two diode chips, making up a bidirectional switch, are sealed in a single semiconductor package.

Japanese Unexamined Patent Publication No. 2005-243685 discloses a technique for coupling an electrode pad and a lead in a power transistor chip by a thick coupling plate in order to improve the heat radiation efficiency of a semiconductor package with a resin-sealed power transistor chip and reduce the on-resistance of the transistor. The coupling plate disclosed in this document is a metal plate with a flat upper surface which has a thin portion and a thick portion, in which the lower side of the thick portion is coupled to a source electrode pad through a conductive adhesive and the lower side of the thin portion is adhered to a source lead through a conductive adhesive.

Japanese Unexamined Patent Publication No. 2005-026294 discloses a technique which ensures stable bondability of a semiconductor package with a resin-sealed power transistor chip by arranging a source electrode pad and a gate electrode pad over the power transistor chip surface so as to prevent contact of a wire bonding tool with lead posts.

SUMMARY OF THE INVENTION

For example, an inverter circuit for a three-phase motor or an inverter circuit for an H bridge motor employs a switch module which combines plural IGBT chips and plural diode chips.

In such a motor inverter circuit, usually a large current of several tens of amperes flows, so if the wiring resistance or parasitic inductance is large, the device may break down due to a reverse induction voltage at the start or stop of the motor.

As for a semiconductor package in which an IGBT chip and a diode chip are mounted over the die pad area of a lead frame, the chips and leads and wires for coupling them are very close to each other in a resin sealing body, so if a high voltage of several hundred volts is applied, an electric discharge occurs between a chip and a wire, which may cause the device to break down.

Furthermore, the switch module used in a motor inverter circuit is used as mounted on a heat radiating plate because a chip generates a considerable amount of heat. For this reason, the semiconductor package which configures the switch module has a screw hole (through hole) for fixing the heat radiating plate on the package. However, this type of semiconductor package has a problem that the interface between the resin around the through hole and the die pad easily peels off due to the temperature cycle.

An object of the present invention is to provide a reliable power semiconductor module.

The above and further objects and novel features of the invention will more fully appear from the following detailed description in this specification and the accompanying drawings.

A typical aspect of the invention disclosed herein is briefly explained below.

According to the typical aspect of the invention, a semiconductor device includes: a sealing body made of insulating resin; a first and a second metal base plate being at least partially covered by the sealing body and each forming a first electrode; a first semiconductor chip having a first electrode on its lower surface and a second electrode pad and a control electrode pad on its upper surface with the lower surface fixed on an upper surface of the first metal base plate through a conductive adhesive; a second semiconductor chip having a first electrode on its lower surface and a second electrode pad and a control electrode pad on its upper surface with the lower surface fixed on an upper surface of the second metal base plate through a conductive adhesive; a first and a second lead each having one end covered by the sealing body and the other end protruding from one lateral side of the sealing body; a first conductive material electrically coupling the second electrode pad of the first semiconductor chip and the one end of the first lead; and a second conductive material electrically coupling the second electrode pad of the second semiconductor chip and the one end of the second lead. Here, the one end of the first lead is located in a higher position than the upper surface of the first metal base plate and the one end of the second lead is located in a higher position than the upper surface of the second metal base plate.

The advantageous effects brought about by the preferred embodiments of the present invention disclosed herein are briefly described below.

Since the length of the wire coupling a semiconductor chip mounted over a metal base plate and a lead is shortened, the wiring resistance and parasitic inductance are decreased, so the possibility of semiconductor chip breakdown due to the reverse induction voltage at the start or stop of the motor can be reduced. Therefore, the reliability of a power semiconductor module can be improved.

DETAILED DESCRIPTION OF THE PREFERRED EMBODIMENTS

Figure 1:
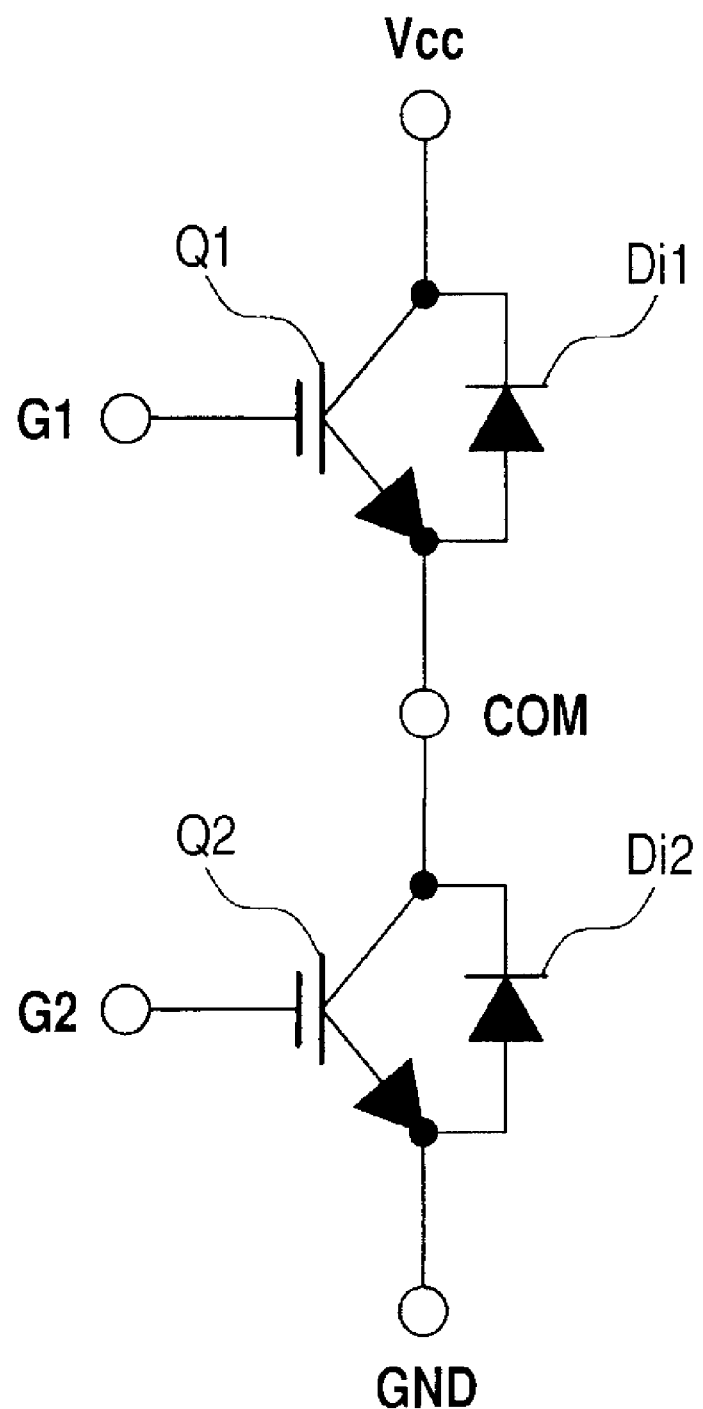
FIG. 1 is an equivalent circuit diagram for a semiconductor package according to a first embodiment of the invention.

Next, the preferred embodiments of the present invention will be described in detail referring to the accompanying drawings. Basically in all the drawings that illustrate the preferred embodiments, elements with like functions are designated by like reference numerals and repeated descriptions of such elements will be omitted.

In connection with the preferred embodiments described below, same or similar explanations will not be repeated except when needed. In the drawings, hatching may be used even in a plan view for easy understanding.

First Embodiment

This embodiment concerns a semiconductor device applied to a switch module used in an inverter circuit for motor control.

FIG. 1 shows the circuit configuration of a switch module according to this embodiment. The switch circuit includes a first semiconductor switch Q1, a second semiconductor switch Q2, a first diode Di1 and a second diode Di2 which are coupled between a pair of terminals (terminals Vcc and GND, or a power terminal and a ground terminal) serving as a current path. The first semiconductor switch Q1 and second semiconductor switch Q2 are each comprised of an IGBT (Insulated Gate Bipolar Transistor) and the first diode Di1 and second diode Di2 are each comprised of a fast recovery diode. The gate electrode of the first semiconductor switch Q1 and the gate electrode of the second semiconductor switch Q2 are coupled with terminal G1 and terminal G2 respectively and the emitter electrode of the first semiconductor switch Q1 and the collector electrode of the second semiconductor switch Q2 are coupled with terminal COM. Also the collector electrode of the first semiconductor switch Q1 and the emitter electrode of the second semiconductor switch Q2 are coupled with the terminal Vcc and terminal GND respectively.

The switch module in this embodiment is sealed in a semiconductor package similar to a so-called TO-3P package.

Figure 2:
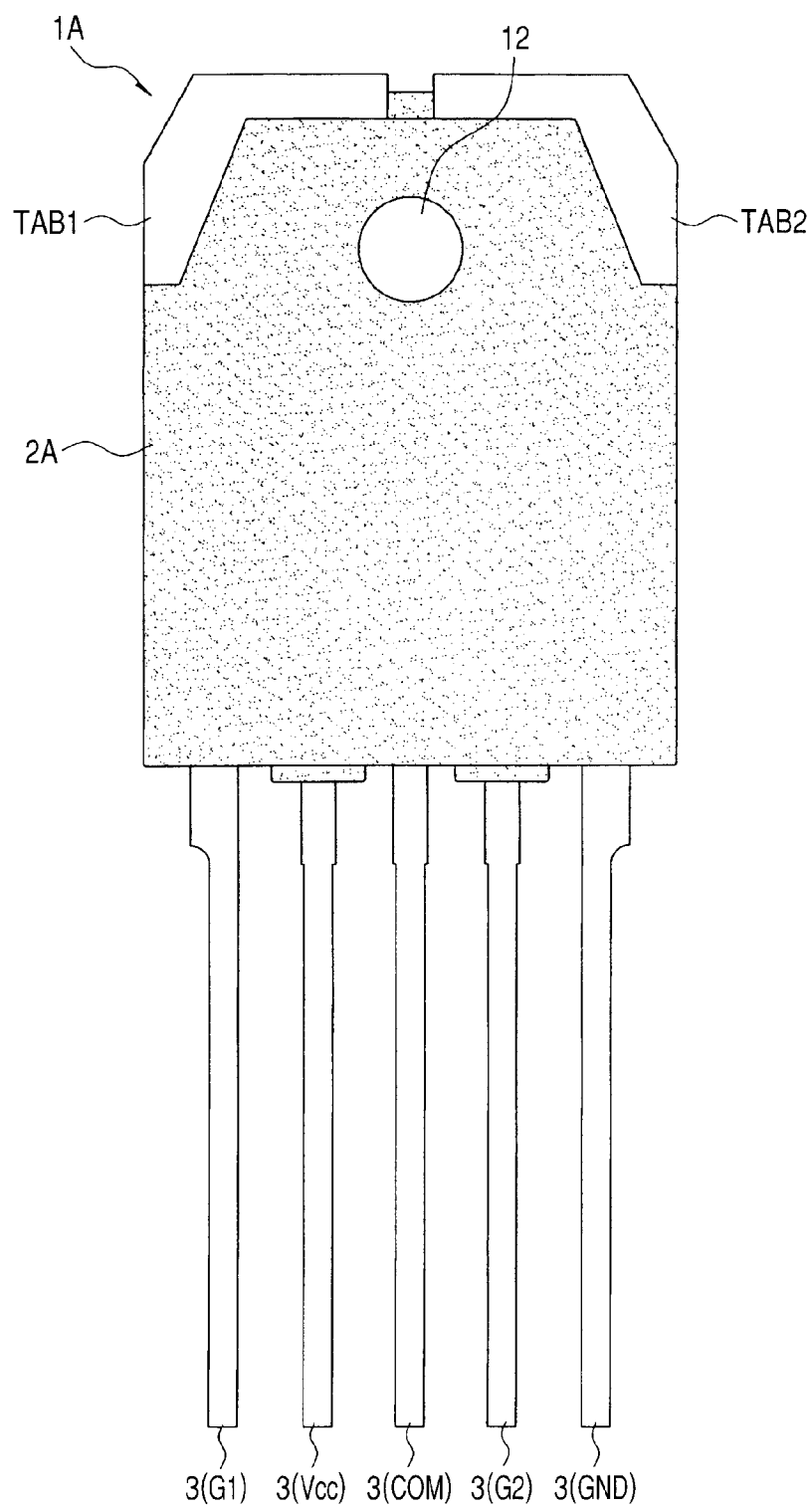
FIG. 2 is a plan view showing the external appearance of the semiconductor package according to the first embodiment.
Figure 3:
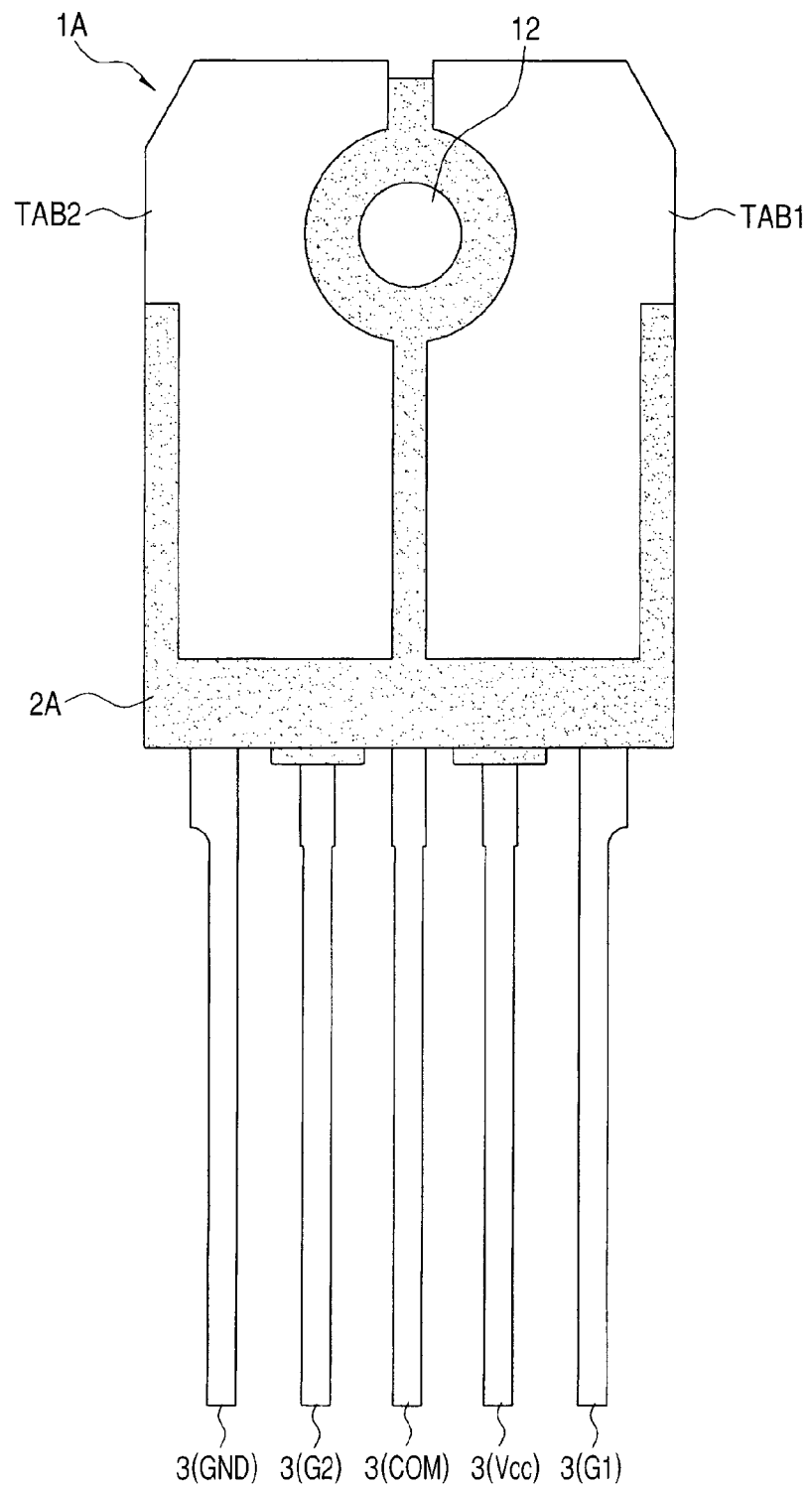
FIG. 3 is a plan view showing the heat radiating plate mounting side of the semiconductor package according to the first embodiment.
Figure 4:
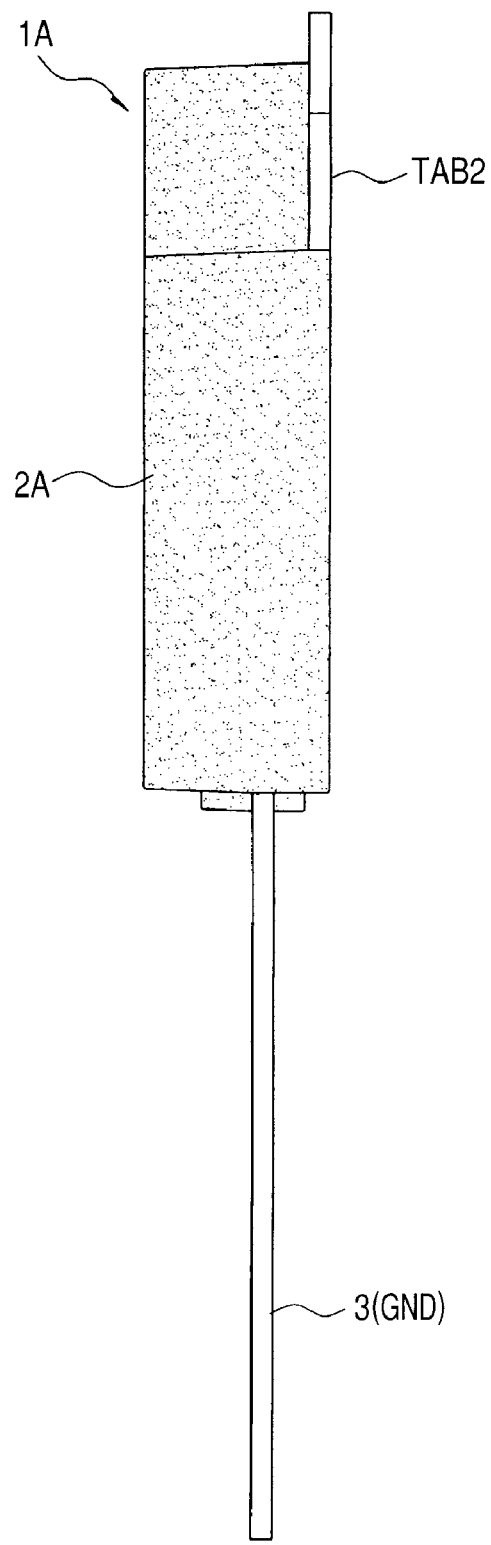
FIG. 4 is a side view of the semiconductor package according to the first embodiment.
Figure 5:
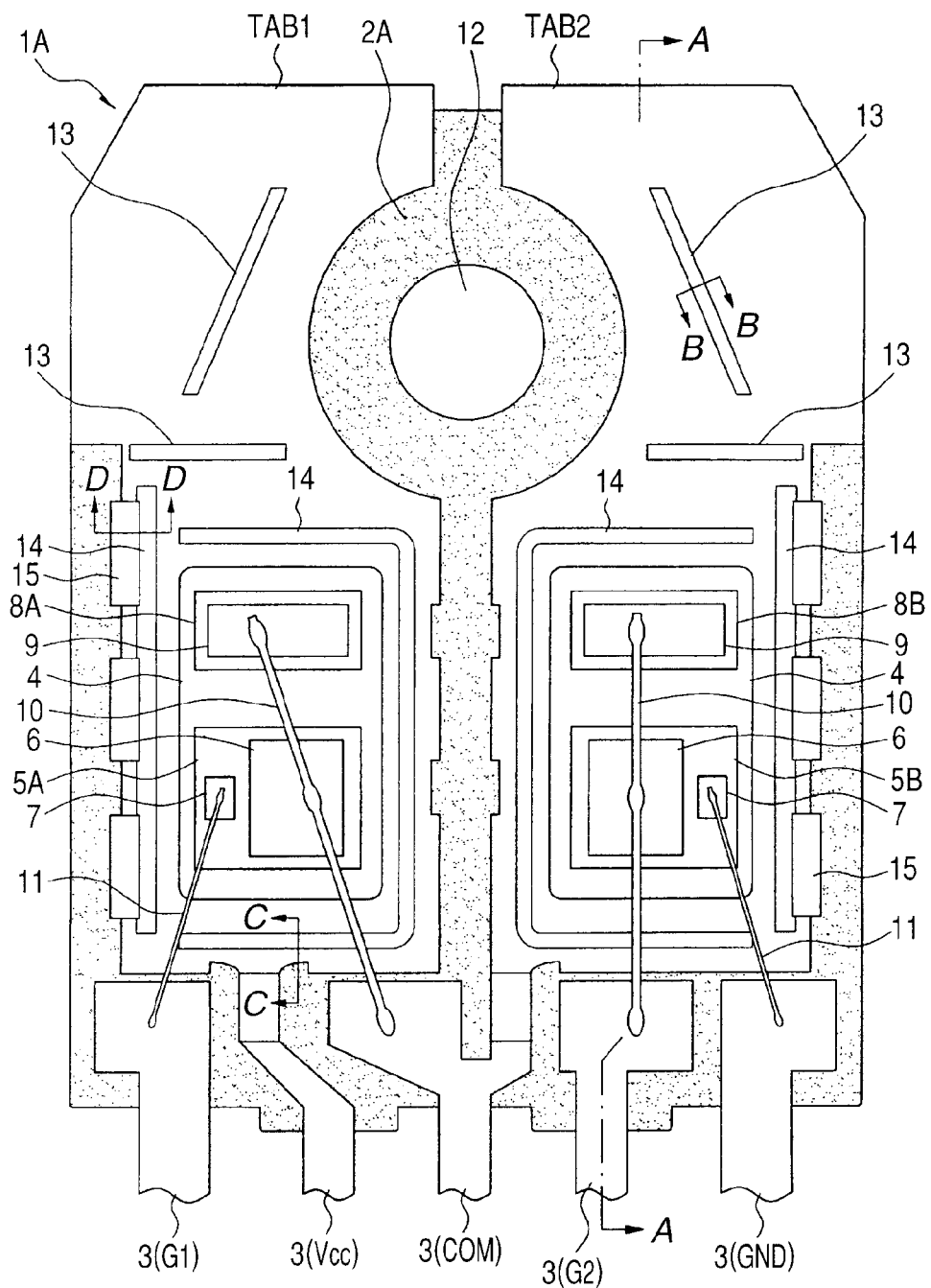
FIG. 5 is a plan view showing the internal structure of the semiconductor package according to the first embodiment.
Figure 6:
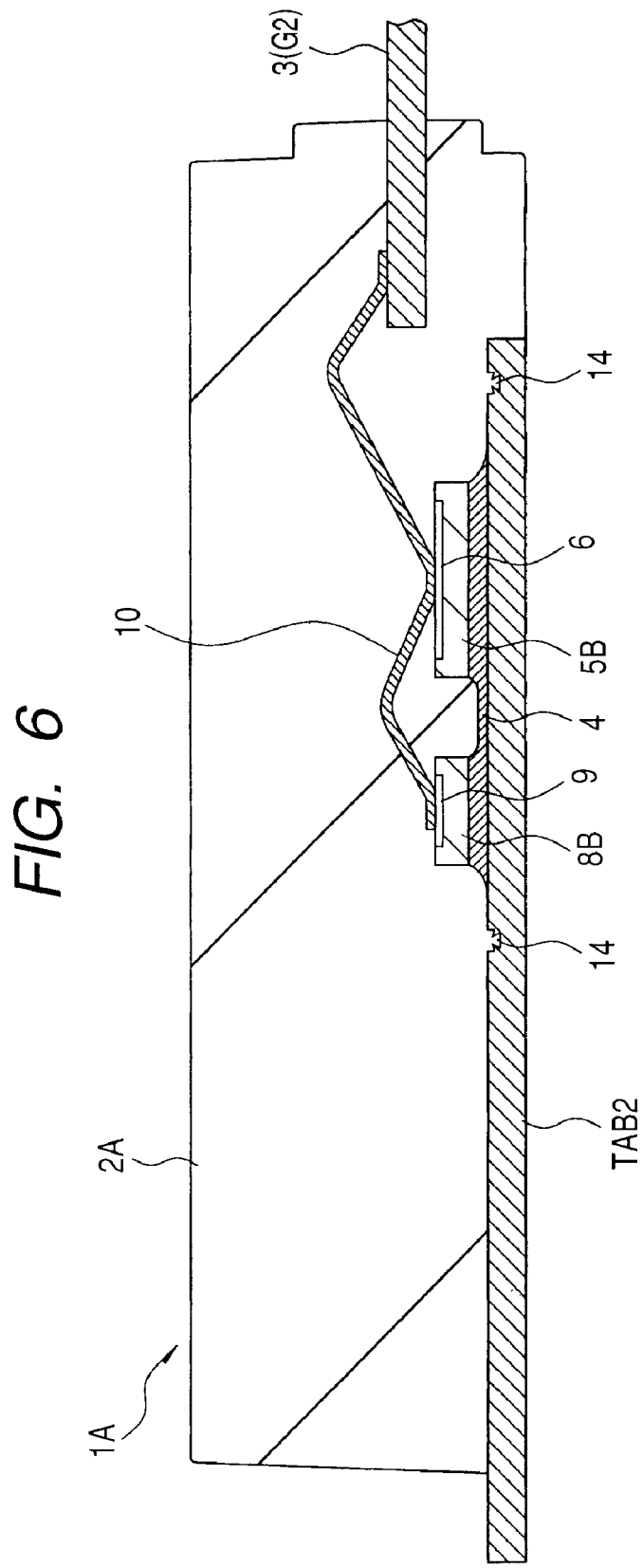
FIG. 6 is a sectional view taken along the line A-A in FIG. 5.

FIG. 2 is a plan view showing the external appearance of the semiconductor package forming the switch module; FIG. 3 is a plan view showing the back side of the semiconductor package (on which the heat radiating plate is mounted); FIG. 4 is a side view of the semiconductor package; FIG. 5 is a plan view showing the internal structure of the semiconductor package; and FIG. 6 is a sectional view taken along the line A-A in FIG. 5.

As for its appearance, the semiconductor package 1A, which configures the switch module, has a flat rectangular sealing body 2A with five leads 3 protruding in parallel from one lateral side of the sealing body 2A. The sealing body 2A is made of epoxy resin impregnated with silicon filler and the leads 3 are made of Cu (copper) or Fe—Ni (iron-nickel) alloy. The surfaces of the leads 3 are coated with three layers: for example, Ni (nickel) film, Pd (palladium) film, and Au (gold) film.

The five leads 3 correspond to the five terminals shown in FIG. 1, namely the lead 3 (Vcc) as a constituent of the terminal VCC, the lead 3 (GND) as a constituent of the terminal GND, the lead 3 (G1) as a constituent of the terminal G1, the lead 3 (G2) as a constituent of the terminal G2, and the lead 3 (COM) as a constituent of the terminal COM. These leads are arranged from the left to the right in the plan view of FIG. 2 in the following order: the lead 3 (G1), the lead 3 (Vcc), the lead 3 (COM), the lead 3 (G2), and the lead 3 (GND).

A pair of die pads (TAB1 and TAB2), separate from each other, are sealed inside the sealing body 2A. The die pads (TAB1 and TAB2) are each a metal base plate of Cu or Fe—Ni alloy and have a function as a heat radiating header. The die pads (TAB1 and TAB2) partially protrude outward from one lateral side of the sealing body 2A (the lateral side opposite to the lateral side where the five leads 3 are arranged). The lower surface of each of the die pads (TAB1 and TAB2) is exposed from the lower surface of the sealing body 2A. The die pad TAB1 is integral with the lead 3 (Vcc) for the terminal Vcc and the die pad TAB2 is integral with the lead 3 (COM) for the terminal COM. The die pads (TAB1 and TAB2) and the leads 3 are, for example, 0.6 mm or so in thickness.

A semiconductor chip 5A is mounted over the upper surface of the die pad TAB1 through a conductive adhesive 4, for example, solder such as Pb—Sn—Ag solder or Sn—Sb solder or Ag paste and a semiconductor chip 5B is mounted over the upper surface of the die pad TAB2 through a conductive adhesive 4. An IGBT which has a collector electrode as a first electrode, an emitter electrode as a second electrode, and a gate electrode as a control electrode is formed in each of the semiconductor chips 5A and 5B. The semiconductor chips 5A and 5B are square when viewed from above and measures 4 mm or so per side.

The lower surface of each of the semiconductor chips 5A and 5B, which is in contact with the conductive adhesive 4, forms a collector electrode. The collector electrode of the semiconductor chip 5A is electrically coupled with the die pad TAB1 through the conductive adhesive 4 and thus electrically coupled with the lead 3 (Vcc) integral with the die pad TAB1, namely with the terminal Vcc. The collector electrode of the semiconductor chip 5B is electrically coupled with the die pad TAB2 through the conductive adhesive 4 and thus electrically coupled with the lead 3 (COM) integral with the die pad TAB2, namely with the COM terminal.

An emitter pad 6 electrically coupled with the emitter electrode of the IGBT and a gate pad 7 electrically coupled with the gate electrode of the IGBT are formed over the upper surface of each of the semiconductor chips 5A and 5B. The emitter pad 6 and the gate pad 7 are comprised of, for example, aluminum (Al) alloy. The emitter pad 6 is larger than the gate pad 7 because the on resistance of the IGBT is to be reduced.

Figure 7A:
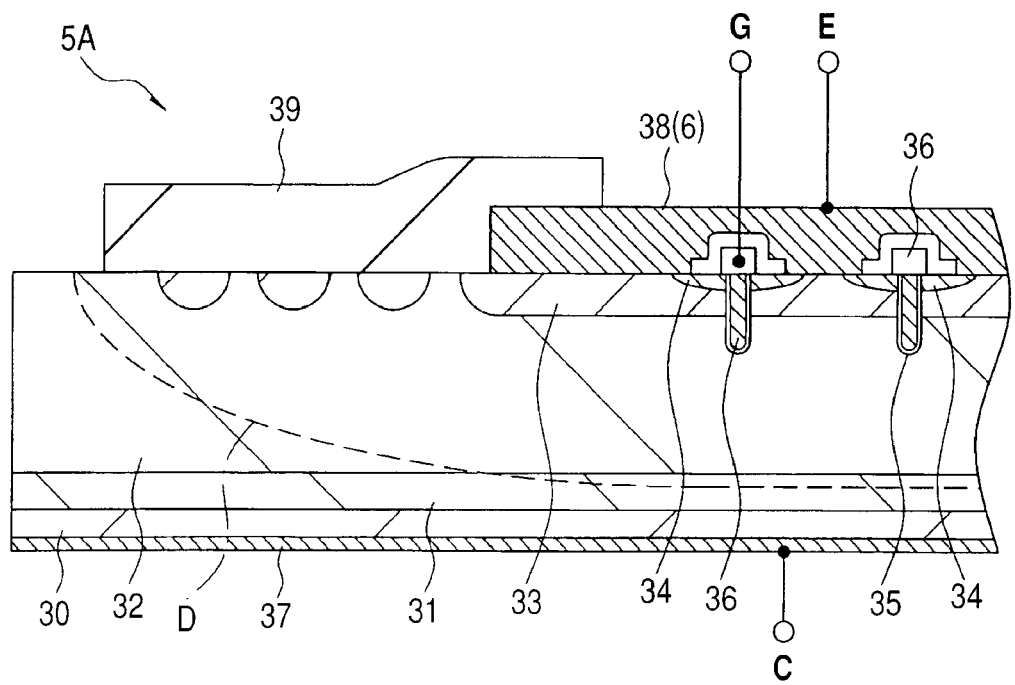
FIG. 7(a) is a fragmentary sectional view of a semiconductor chip 5A with an IGBT formed therein and FIG. 7(b) is an equivalent circuit diagram for the IGBT.
Figure 7B:
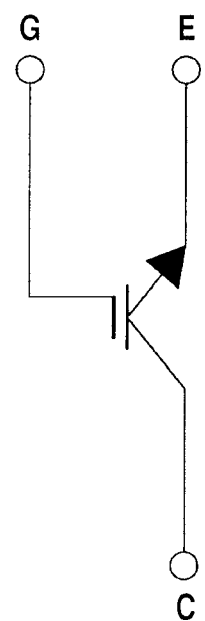

FIG. 7(a) is a fragmentary sectional view of the semiconductor chip 5A with an IGBT formed therein and FIG. 7(b) is an equivalent circuit diagram for the IGBT. This is an example of an n-channel IGBT having a trench gate structure. The structure of the semiconductor chip 5B is the same as that of the semiconductor chip 5A so its description is omitted.

An $n^+$ buffer layer 31 and an $n^-$ epitaxial layer 32 are formed over a $p^+$ silicon substrate 30, and a $p^+$ diffusion layer 33 and an $n^+$ diffusion layer 34 are formed over the surface of the $n^-$ epitaxial layer 32. A trench reaching the $n^-$ epitaxial layer 32 through the $n^+$ diffusion layer 34 and $p^+$ diffusion layer 33 is formed in part of the $n^+$ diffusion layer 34, and a gate insulating film 35 as a silicon oxide film and a gate electrode 36 as a polycrystalline silicon film are formed in the trench.

The $p^+$ silicon substrate 30, $n^+$ buffer layer 31, $n^{31}$ epitaxial layer 32, and $p^+$ diffusion layer 33 make up the PNP transistor part of the IGBT, and the $p^+$ diffusion layer 33, $n^+$ diffusion layer 34, gate insulating film 35, and gate electrode 36 make up the MOSFET part of the IGBT. A collector electrode 37 is formed over the back side of the $p^+$ silicon substrate 30 and an emitter electrode 38 is formed over the $p^+$ diffusion layer 33 and $n^+$ diffusion layer 34.

A surface protective film 39 covering the top surface of the $p^+$ silicon substrate 30 is formed over the emitter electrode 38. The emitter electrode 38 is made as an Al alloy film and the surface protective film 39 is made as a polyimide resin film. The area of the emitter electrode 38 which is not covered by the surface protective film 39, namely the exposed surface area of the semiconductor chip 5A, configures the abovementioned emitter pad 6. Though not shown, the gate electrode 36 is coupled with a gate extraction electrode as an Al alloy film lying in the same layer as the emitter electrode 38. The area of the gate extraction electrode which is not covered by the surface protective film 39, namely the exposed surface area of the semiconductor chip 5A configures the above gate pad 6.

As illustrated in FIG. 5, a diode chip 8A is mounted in a region adjacent to the semiconductor chip 5A over the upper surface of the die pad TAB1 through a conductive adhesive 4. Also, a diode chip 8B is mounted in a region adjacent to the semiconductor chip 5B over the upper surface of the die pad TAB2 through a conductive adhesive 4. A cathode electrode is formed over the lower surface of each of the diode chips 8A and 8B which is in contact with the conductive adhesive 4 and an anode electrode is formed over its upper surface. An anode pad 9, which is part of the anode electrode, is exposed on the upper surface of each of the diode chips 8A and 8B. The anode electrode and cathode electrode are made of Au films.

Figure 8A:
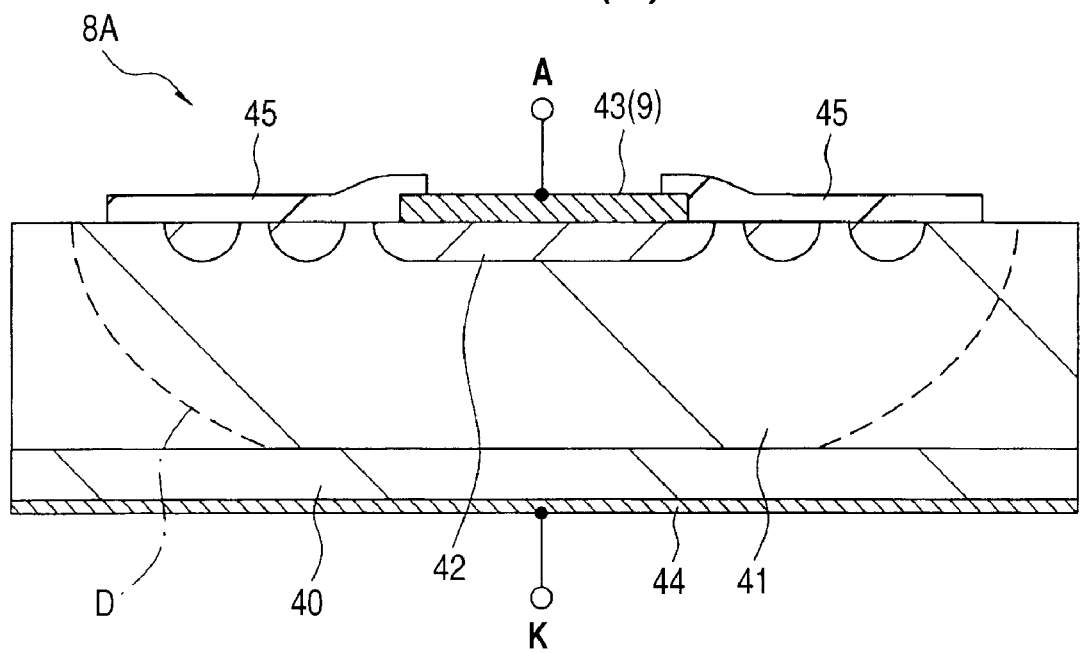
FIG. 8(a) is a sectional view of a diode chip 8A and FIG. 8(b) is an equivalent circuit diagram for the diode.
Figure 8B:
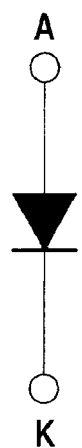

FIG. 8(a) is a sectional view of the diode chip 8A and FIG. 8(b) is an equivalent circuit diagram for the diode. The structure of the diode chip 8B is the same as that of the diode chip 8A.

An $n^-$ epitaxial layer 41 is formed over an $n^+$ silicon substrate 40 and a $p^+$ diffusion layer 42 is formed over the surface of the $n^-$ epitaxial layer 41. An anode electrode 43 is formed over the surface of the $p^+$ diffusion layer 42 and a cathode electrode 44 is formed over the back side of the $n^+$ silicon substrate 40.

A surface protective film 45 covering the top surface of the $n^+$ silicon substrate 40 is formed over the anode electrode 43. The anode electrode 43 is an Al alloy film and the surface protective film 45 is a polyimide resin film. The area of the anode electrode 43 which is not covered by the surface protective film 45, namely the exposed surface area of the diode chip 8A, configures the above anode pad 9.

As illustrated in FIG. 5, the anode pad 9 of the diode chip 8A, the emitter pad 6 of the semiconductor chip 5A, and the lead 3 (COM) are electrically coupled with each other by a single Al wire 10 (conductive material), and the gate pad 7 of the semiconductor chip 5A and the lead 3 (G1) are electrically coupled with each other by a single Al wire 11 (conductive material). Also, the anode pad 9 of the diode chip 8B, the emitter pad 6 of the semiconductor chip 5B, and the lead 3 (G2) are electrically coupled with each other by a single Al wire 10, and the gate pad 7 of the semiconductor chip 5B and the lead 3 (GND) are electrically coupled with each other by a single Al wire 11.

The Al wire 10 for coupling the anode pad 9 of the diode chip 8A, the emitter pad 6 of the semiconductor chip 5A, and the lead 3 (COM), and the Al wire 10 for coupling the anode pad 9 of the diode chip 8B, the emitter pad 6 of the semiconductor chip 5B, and the lead 3 (G2) serve as current paths in the switch circuit where a large current flows. For this reason, these Al wires 10 have a larger diameter than the Al wire 11 for coupling the gate pad 7 of the semiconductor chip 5A and the lead 3 (G1) and the Al wire for coupling the gate pad 7 of the semiconductor chip 5B and the lead 3 (GND). For example, the diameter of the Al wires 10 is 300 to 500 μm and the diameter of the Al wires 11 is 125 to 150 μm.

For the switch module in this embodiment, the switch circuit as shown in FIG. 1 is implemented by one semiconductor package 1A in which the semiconductor chip 5A and diode chip 8A both mounted over the upper surface of the die pad TAB1 and the semiconductor chip 5B and diode chip 8B both mounted over the upper surface of the die pad TAB2, the leads 3 and Al wires 10 and 11 are coupled as mentioned above.

Figure 9:
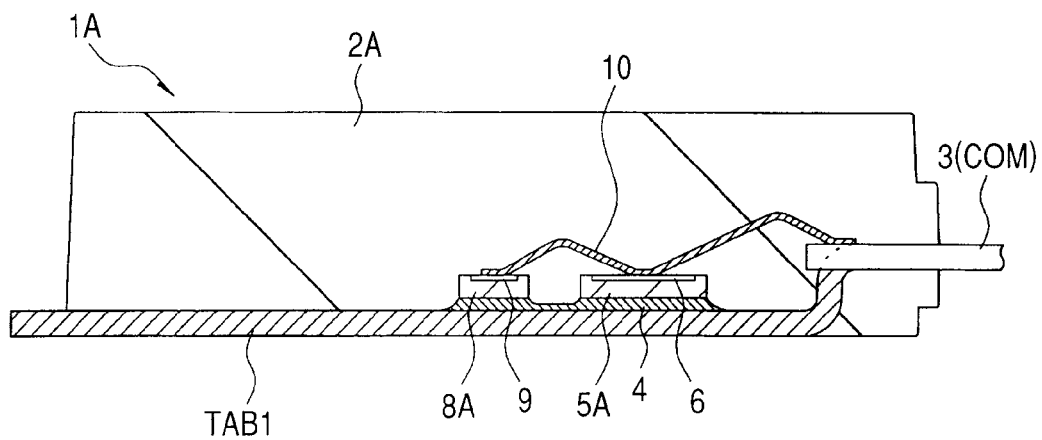
FIG. 9 is a schematic sectional view of the semiconductor package, showing the positional relation between a die pad and a lead.
Figure 10:
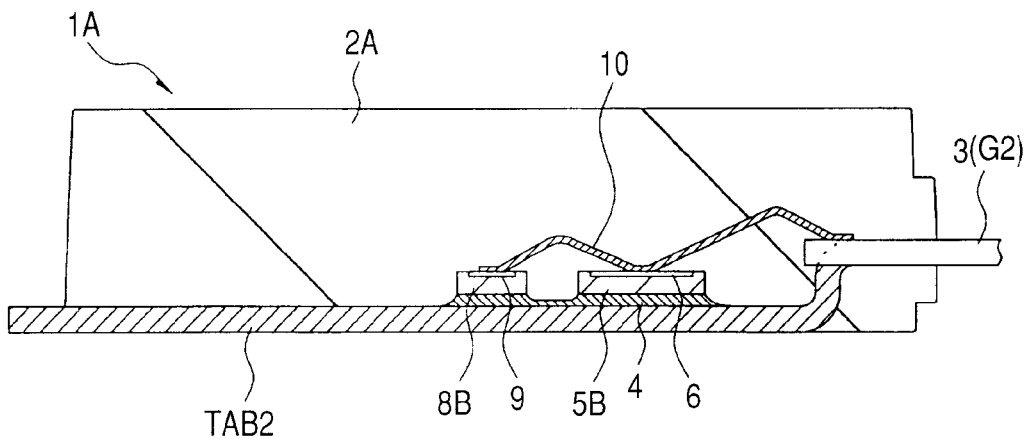
FIG. 10 is a schematic sectional view of the semiconductor package, showing the positional relation between another die pad and another lead.

FIG. 9 is a schematic sectional view of the semiconductor package 1A, showing the positional relation between the die pad TAB1 and lead 3 (COM), and FIG. 10 is a schematic sectional view of the semiconductor package 1A, showing the positional relation between the die pad TAB2 and lead 3 (G2).

As illustrated in FIG. 9, one end of the lead 3 (COM) disposed adjacent to the die pad TAB1 is located in a higher position than the upper surface of the die pad TAB1. Also, as illustrated in FIG. 10, one end of the lead 3 (G2) disposed adjacent to the die pad TAB2 is located in a higher position than the upper surface of the die pad TAB2.

As mentioned above, the semiconductor chip 5A and the diode chip 8A are mounted over the upper surface of the die pad TAB1 through the conductive adhesive 4. The anode pad 9 of the diode chip 8A, the emitter pad 6 of the semiconductor chip 5A, and the lead 3 (COM) are coupled with each other by the Al wire 10. Also the semiconductor chip 5B and the diode chip 8B are mounted over the upper surface of the die pad TAB2 through the conductive adhesive 4. The anode pad 9 of the diode chip 8B, the emitter pad 6 of the semiconductor chip 5B, and the lead 3 (G2) are coupled with each other by the Al wire 10.

Since one end of the lead 3 (COM) is located in a higher position than the upper surface of the die pad TAB1 in this way, the length of the Al wire 10 for coupling the emitter pad 6 of the semiconductor chip 5A and the lead 3 (COM) can be shorter than when one end of the lead 3 (COM) is at the same level as the upper surface of the die pad TAB1, so the parasitic inductance and resistance of the Al wire 10 can be decreased. Likewise, since one end of the lead 3 (G2) is located in a higher position than the upper surface of the die pad TAB2, the length of the Al wire 10 for coupling the emitter pad 6 of the semiconductor chip 5B and the lead 3 (G2) can be shorter than when one end of the lead 3 (G2) is at the same level as the upper surface of the die pad TAB2, so the parasitic inductance and resistance of the Al wire 10 can be decreased.

In addition, if one end of the lead 3 (COM) is at the same level as the upper surface of the die pad TAB1, the distance between the conductive adhesive 4 spreading around the semiconductor chip 5A, and the Al wire 10 above it, will be short, so if the amount of conductive adhesive spreading around the semiconductor chip 5A is large, short-circuiting may occur between the conductive adhesive 4 and Al wire 10. On the other hand, in the semiconductor device according to this first embodiment, since one end of the lead 3 (COM) is located in a higher position than the upper surface of the die pad TAB1 and the distance between the conductive adhesive 4 spreading around the semiconductor chip 5A, and the Al wire 10 above it, is longer, even if a large amount of conductive adhesive 4 spreads around the semiconductor chip 5A, short-circuiting with the Al wire 10 will not occur. For the same reason, since one end of the lead 3 (G2) is located in a higher position than the upper surface of the die pad TAB2, even if a large amount of conductive adhesive 4 spreads around the semiconductor chip 5B, short-circuiting with the Al wire 10 will not occur.

Furthermore, when coupling the emitter pad 6 of the semiconductor chip 5A and the lead 3 (COM) by the Al wire 10, if the distance between the outermost peripheral area of the upper surface of the semiconductor chip 5A and the Al wire above it is as short as 100 μm or so, a discharge may occur between the semiconductor chip 5A and the Al wire 10 during operation of the switch module, causing the device (IGBT) to break down. This is because when the IGBT is held at the reverse voltage, the outermost peripheral area of the semiconductor chip 5A lying outside the depletion layer (D) as indicated by dotted line in FIG. 7(a) has the same potential as the back side (collector electrode) of the semiconductor chip 5A, and a high voltage of several hundred volts is thus applied.

However, when one end of the lead 3 (COM) is located in a higher position than the upper surface of the die pad TAB1 as in this embodiment, the distance between the outermost peripheral area of the upper surface of the semiconductor chip 5A, and the Al wire 10 above it, is longer than when one end of the lead 3 (COM) is at the same level as the upper surface of the die pad TAB1, so that a discharge between the semiconductor chip 5A and the Al wire 10 is unlikely to occur. Also, since one end of the lead 3 (G2) is located in a higher position than the upper surface of the die pad TAB2, for the same reason as above a discharge between the semiconductor chip 5B and Al wire 10 is unlikely to occur.

When the diode is held at the reverse voltage, the outermost peripheral area of the upper surface of the diode chip 8A lying outside the depletion layer (D) as illustrated in FIG. 8(a) has the same potential as the back side (cathode electrode 44) and a high voltage of several hundred volts is thus applied. Therefore, when the anode pad 9 of the diode chip 8A (8B) and the Al wire 10 are to be coupled, it is preferable that the distance between the outermost peripheral area of the diode chip 8A (8B) and the Al wire 10 be 100 μm or more.

As illustrated in FIGS. 2, 3 and 5, the semiconductor package 1A in this embodiment has a circular through hole 12 in the center of the sealing body 2A which lies outside the semiconductor chips 5A and 5B. This through hole 12 is a screw hole used to fix the semiconductor package 1A on a heat radiating plate. In the semiconductor package 1A, the interface between the resin (sealing body 2A) around the through hole 12 and the die pad (TAB1, TAB2) easily peels off due to the temperature cycle.

Figure 11:
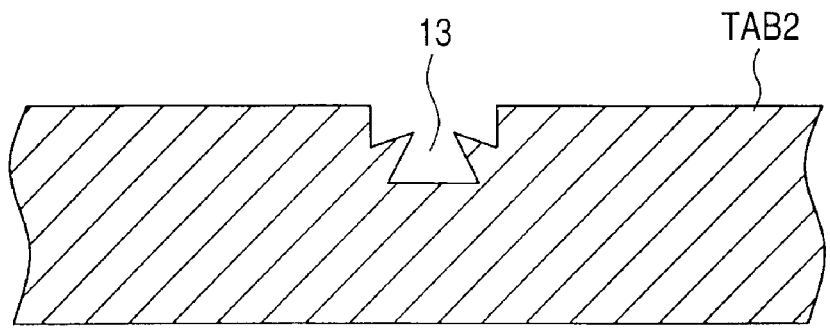
FIG. 11 is a sectional view taken along the line B-B in FIG. 5.

As a solution to this problem, the semiconductor package 1A in this embodiment has grooves 13 for resin fixation in the die pad (TAB1 and TAB2) areas around the through hole 12. FIG. 11 shows the cross section of the groove as taken along the line B-B in FIG. 5. As illustrated in FIG. 11, the inner wall of the groove 13 is reversely tapered in a way to form steps so that the resin in the groove 13 hardly moves out of the groove due to an anchor effect. Therefore, the presence of the groove 13 in the die pad (TAB1, TAB2) around the through hole 12 prevents the interface between the sealing body 2A and the die pad (TAB1, TAB2) from peeling off.

Figure 12:
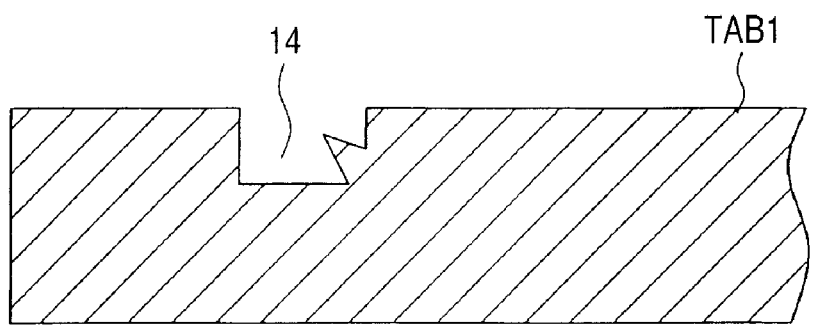
FIG. 12 is a sectional view taken along the line C-C in FIG. 5.

The semiconductor package 1A in this embodiment also has grooves 14 for resin fixation in the die pad (TAB1, TAB2) around the area where the semiconductor chip (5A, 5B) and diode chip (8A, 8B) are mounted. FIG. 12 shows the cross section of the groove 14 as taken along the line C-C in FIG. 5. The grooves 14, lying around the chip mounting area, also have a function to prevent the conductive adhesive 4 from spreading outside the chip mounting area when mounting the semiconductor chip (5A, 5B) and diode chip (8A, 8B) over the die pad (TAB1, TAB2). These grooves 13 and 14 are formed by tapping the surfaces of the die pads (TAB1 and TAB2) with a press die.

Figure 13:
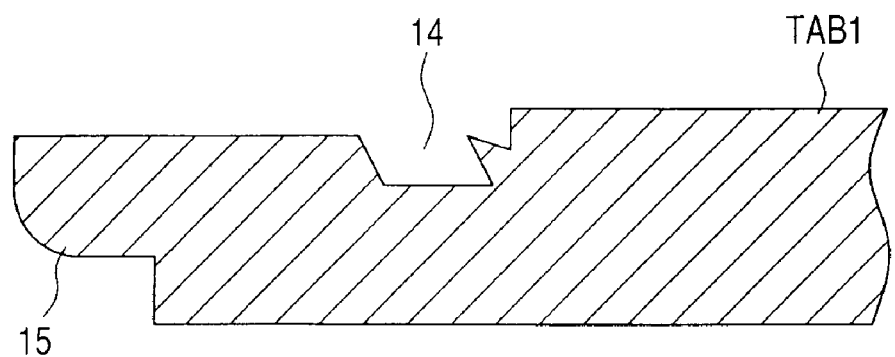
FIG. 13 is a sectional view taken along the line D-D in FIG. 5.

Furthermore, as illustrated in FIG. 13 (sectional view taken along the line D-D in FIG. 5), the die pad TAB 1 (TAB2) has a thin portion 15 with a smaller thickness than the other portions of the die pad at one end. This thin portion 15 is formed by pressing the end of the die pad TAB 1 (TAB2) with a press die. Due to the presence of the thin portion 15 at the end of the die pad TAB1 (TAB2) in contact with the sealing body 2A, the sectional profile of the end of the die pad TAB1 (TAB2) has a staircase-like form, so that due to an anchor effect, the strength of adhesion to the sealing body 2A is increased, thereby preventing the interface between the die pad TAB1 (TAB2) and the sealing body 2A from peeling off.

Figure 14:
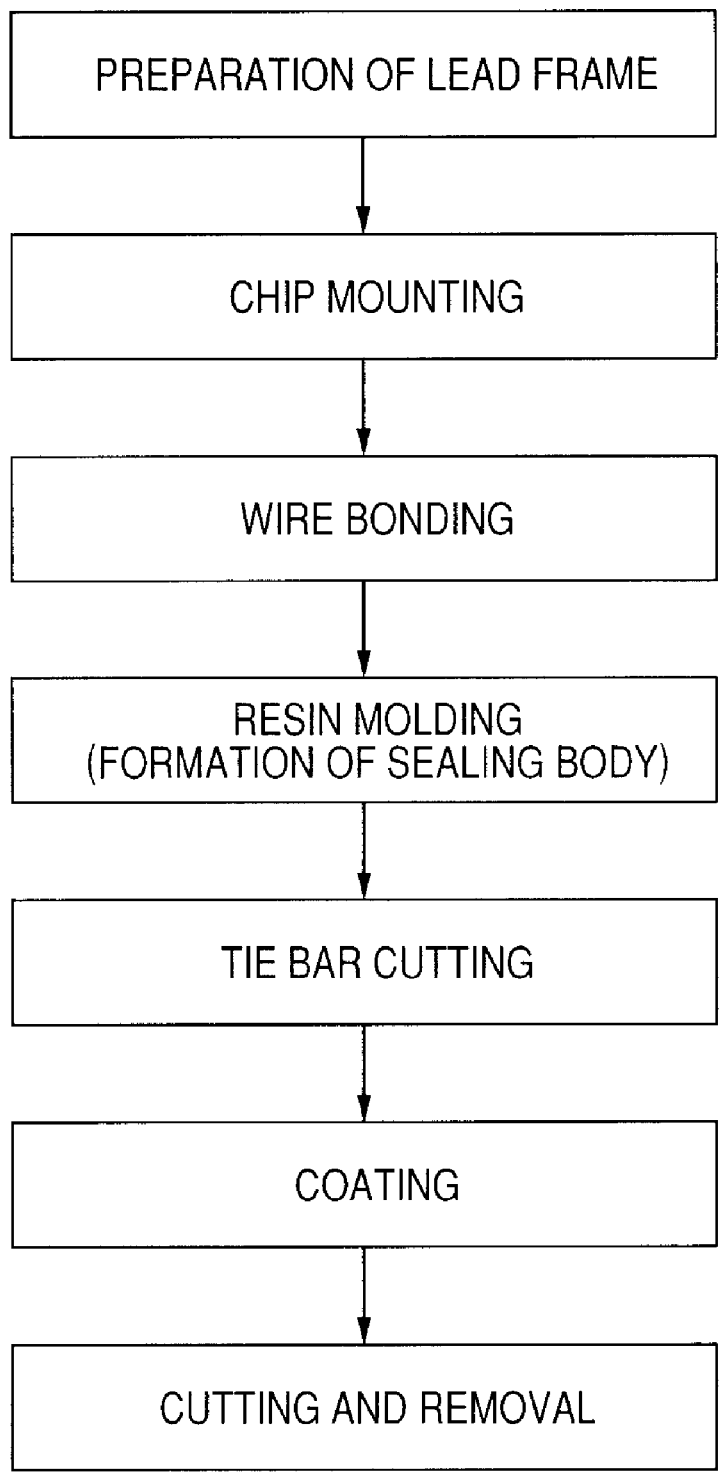
FIG. 14 shows a general flow of the process of assembling the semiconductor package according to the first embodiment.

Next, the method for assembling the semiconductor package 1A according to this embodiment will be described. FIG. 14 shows a general flow of the assembling process.

Figure 15:
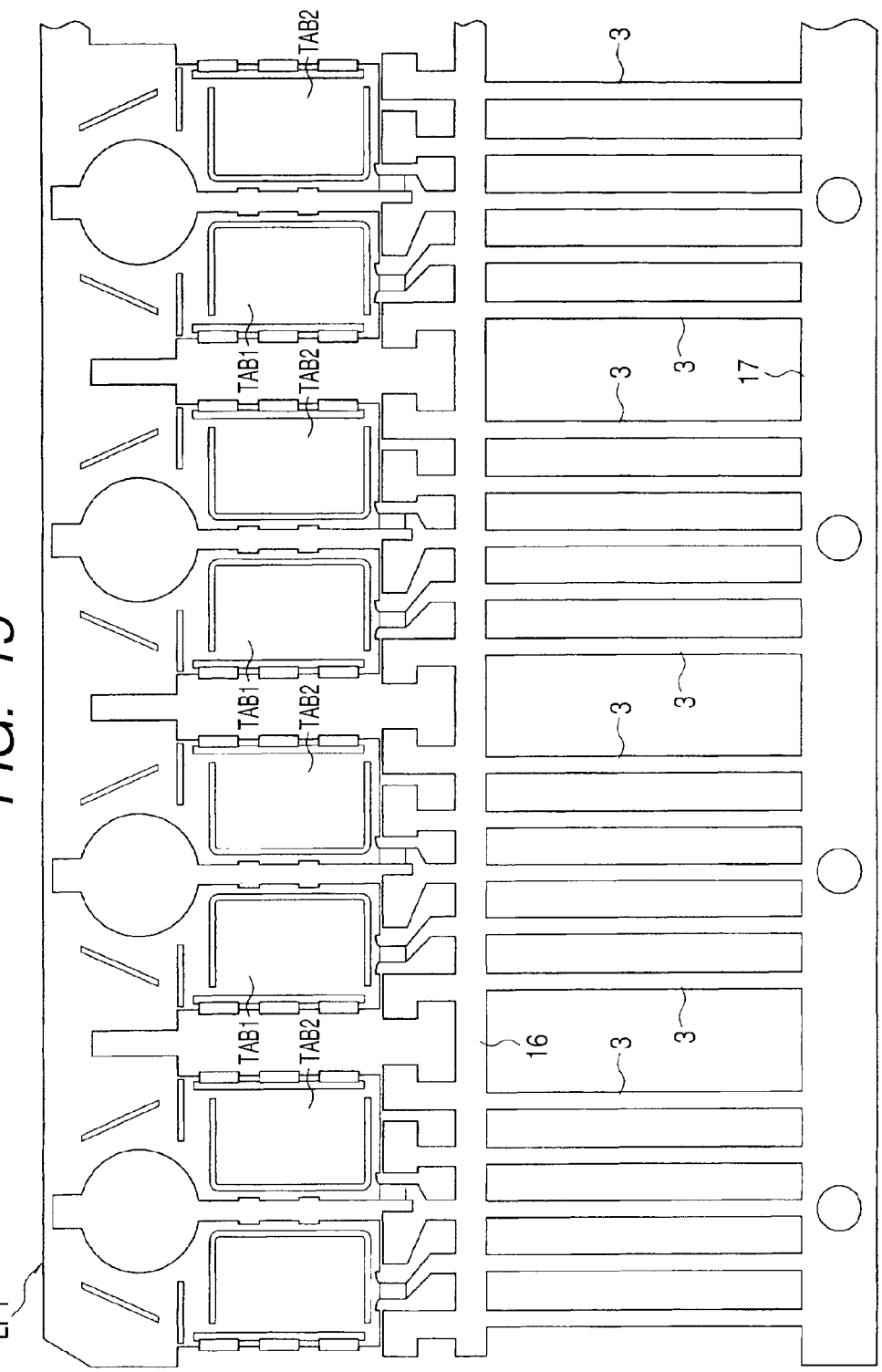
FIG. 15 is a plan view showing a step in the method for manufacturing the semiconductor package according to the first embodiment.

First, as illustrated in FIG. 15, a lead frame LF1, in which die pads (TAB1, TAB2) for a plurality of packages are coupled by a tie bar 16 and a frame 17, is prepared.

Figure 16:
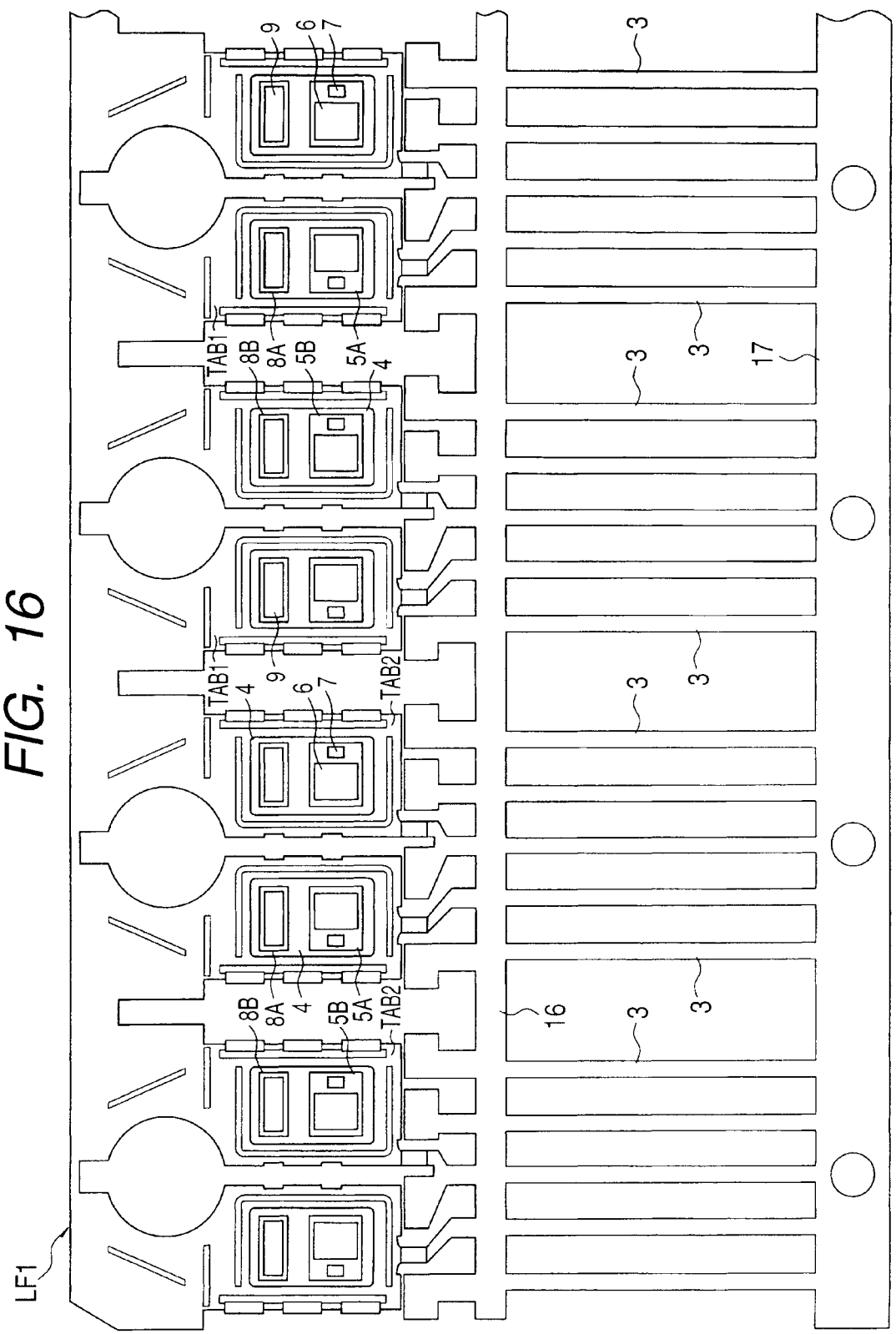
FIG. 16 is a plan view showing a semiconductor manufacturing step subsequent to the step in FIG. 15.

Next, as illustrated in FIG. 16, a conductive adhesive 4 is supplied to the chip mounting areas of the upper surface of each of the die pads (TAB1, TAB2) and then semiconductor chips 5A and 5B and diode chips 8A and 8B are mounted over the upper surfaces of the die pads (TAB1, TAB2) respectively.

Figure 17:
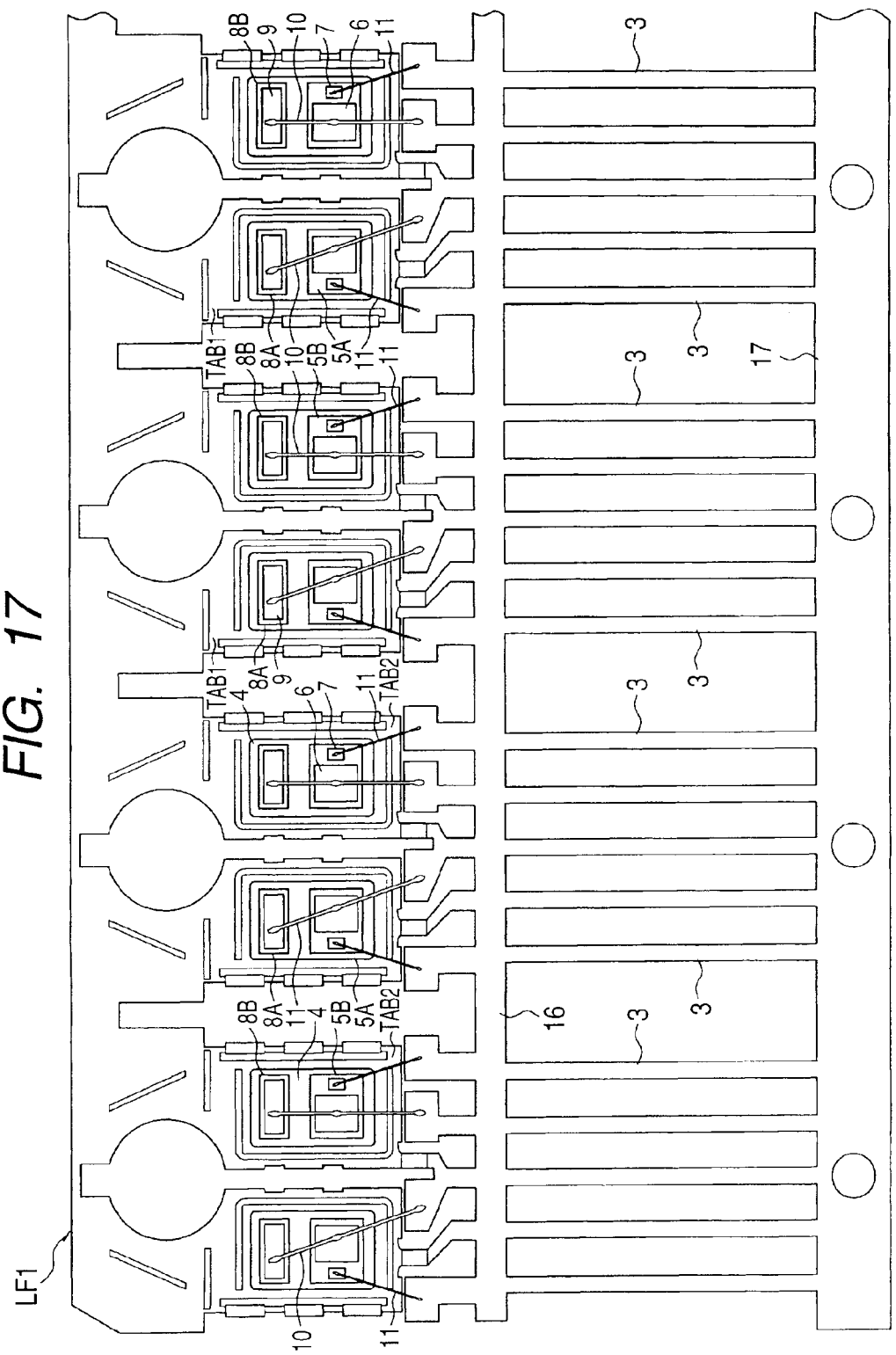
FIG. 17 is a plan view showing a semiconductor manufacturing step subsequent to the step in FIG. 16.

Then, as illustrated in FIG. 17, the semiconductor chip 5A (5B), diode chip 8A (8B) and leads 3 are electrically coupled by Al wires 10 and 11. Coupling by the Al wires 10 and 11 are made, for example, by ultrasonic wedge bonding.

Figure 18:
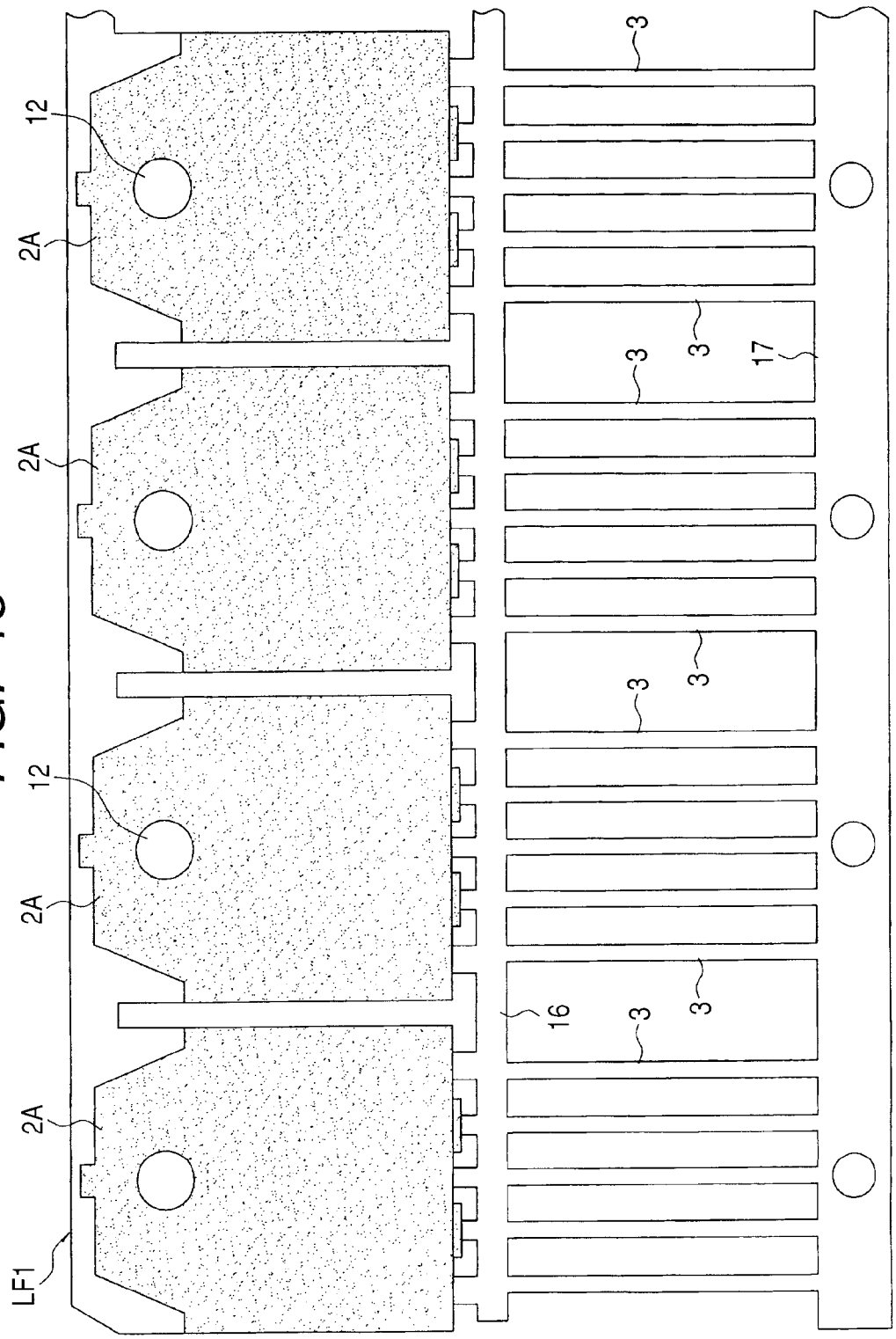
FIG. 18 is a plan view showing a semiconductor manufacturing step subsequent to the step in FIG. 17.

Next, the lead frame LF1 is attached in a mold die (not shown) and as illustrated in FIG. 18, part of each die pad (TAB1, TAB2), the semiconductor chip (5A, 5B), diode chip (8A, 8B) and Al wires 10 and 11 are covered by the sealing body 2A.

Figure 19:
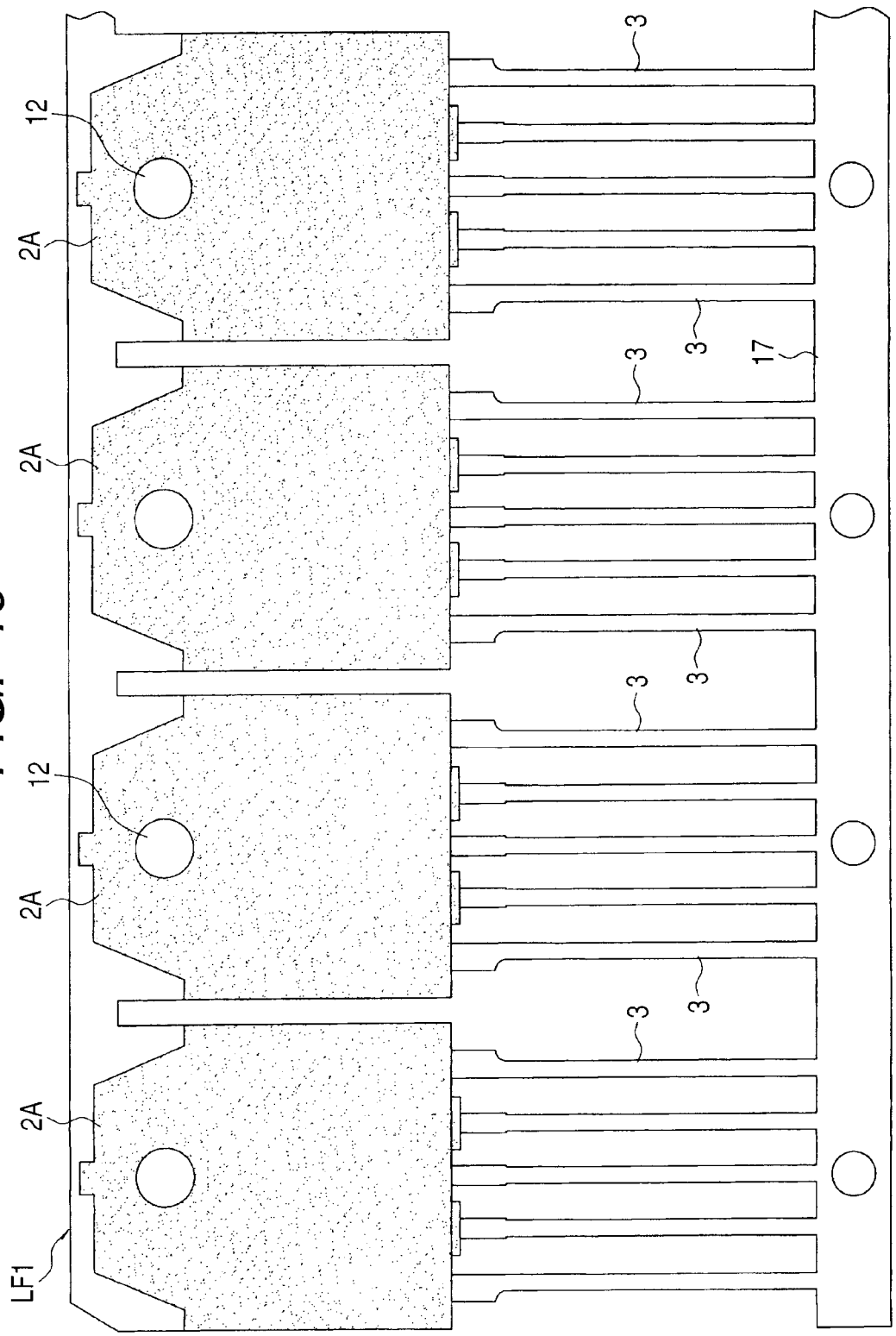
FIG. 19 is a plan view showing a semiconductor manufacturing step subsequent to the step in FIG. 18.
Figure 20:
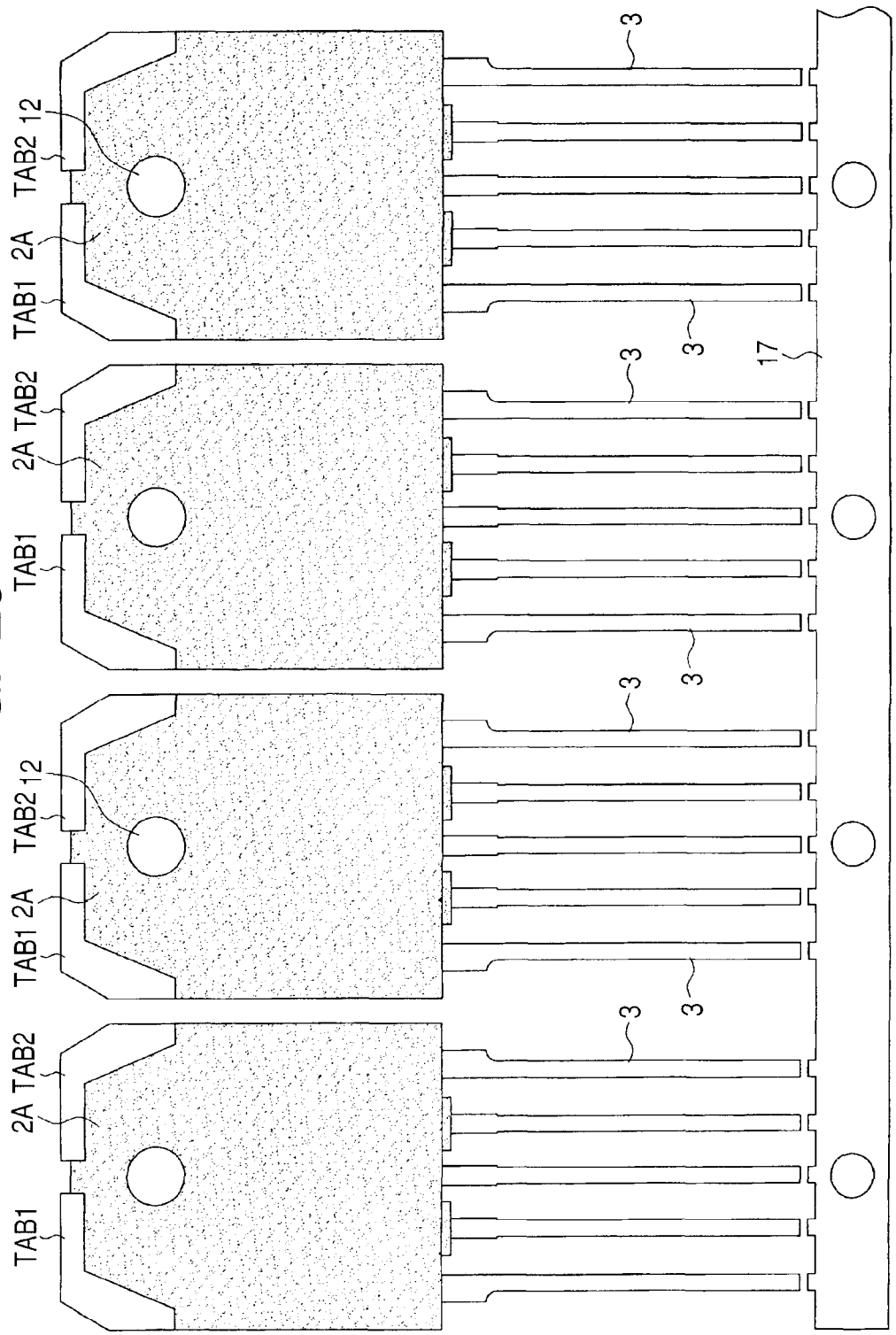
FIG. 20 is a plan view showing a semiconductor manufacturing step subsequent to the step in FIG. 19.

Then, the tie bar 16 is cut and removed as illustrated in FIG. 19 and the surfaces of the leads 3 are coated (not shown), thereafter, unwanted parts of the lead frame LF1 are cut and removed as illustrated in FIG. 20 to complete the semiconductor package 1A according to the first embodiment as shown in FIGS. 2 to 5.

Figure 21:
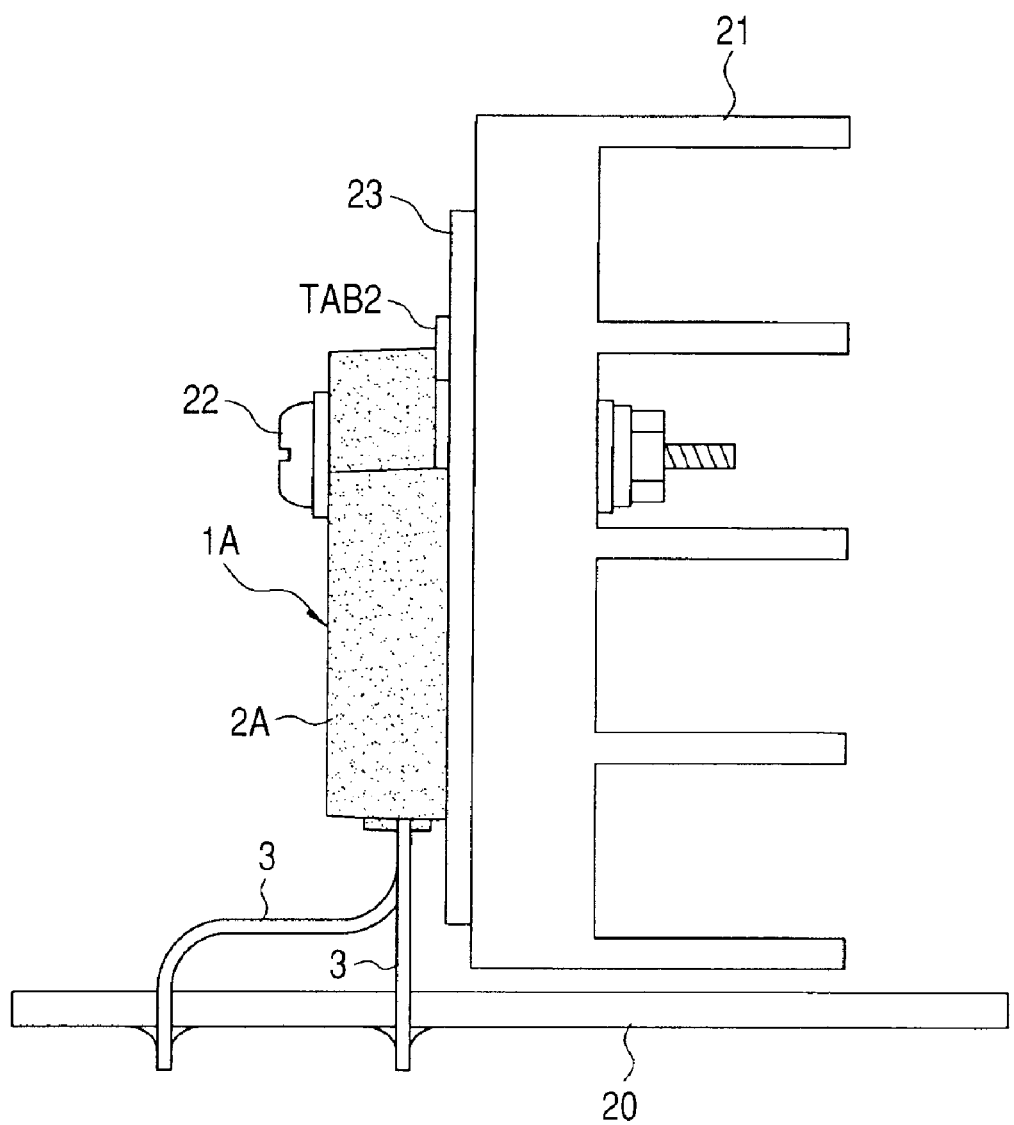
FIG. 21 is a side view showing the semiconductor package according to the first embodiment which is mounted on a wiring board.

FIG. 21 shows the semiconductor package 1A in this embodiment which is mounted on a motor wiring board 20. When mounting the semiconductor package 1A on the wiring board 20, the tips of the leads 3 are inserted in the wiring board 20 and fixed by soldering. In this process, in order to prevent short-circuiting between the leads 3, the five leads 3 may be folded alternately before being inserted in the wiring board 20. If a heat radiating plate 21 of aluminum or similar material is to be attached to the back side of the semiconductor package 1A, a screw 22 is inserted into the through hole 12 in the sealing body 2A to fix the heat radiating plate 21. In this process, in order to prevent short-circuiting between the exposed die pads (TAB1, TAB2) on the back side of the semiconductor package 1A and the heat radiating plate 21, an insulating plate 23 of silicon rubber or similar material is interposed between the semiconductor package 1A and the heat radiating plate 21.

Figure 22:
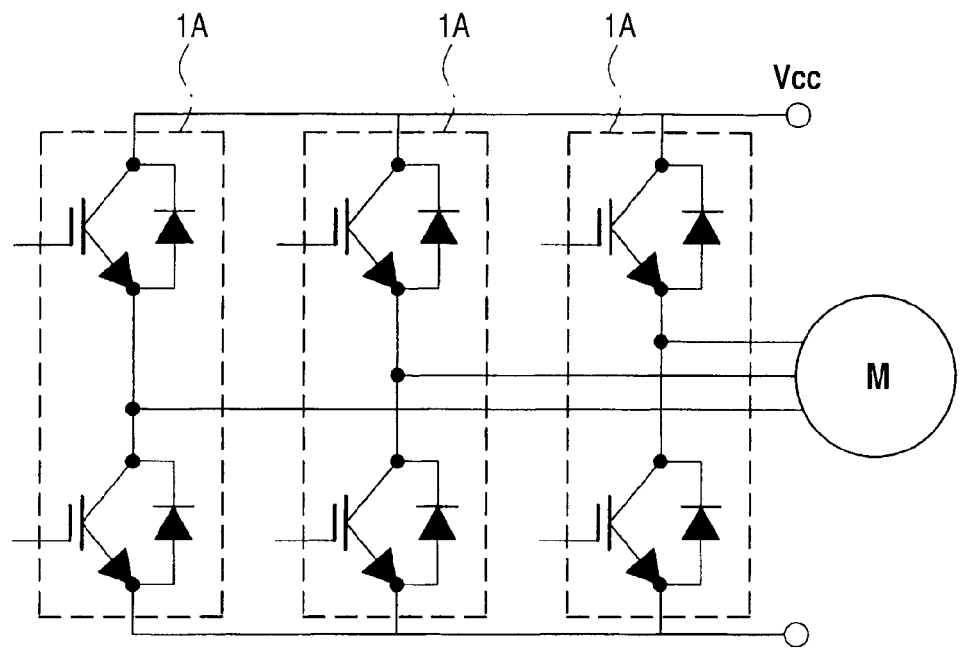
FIG. 22 shows an example of a three-phase motor inverter circuit which uses the semiconductor package according to the first embodiment.
Figure 23:
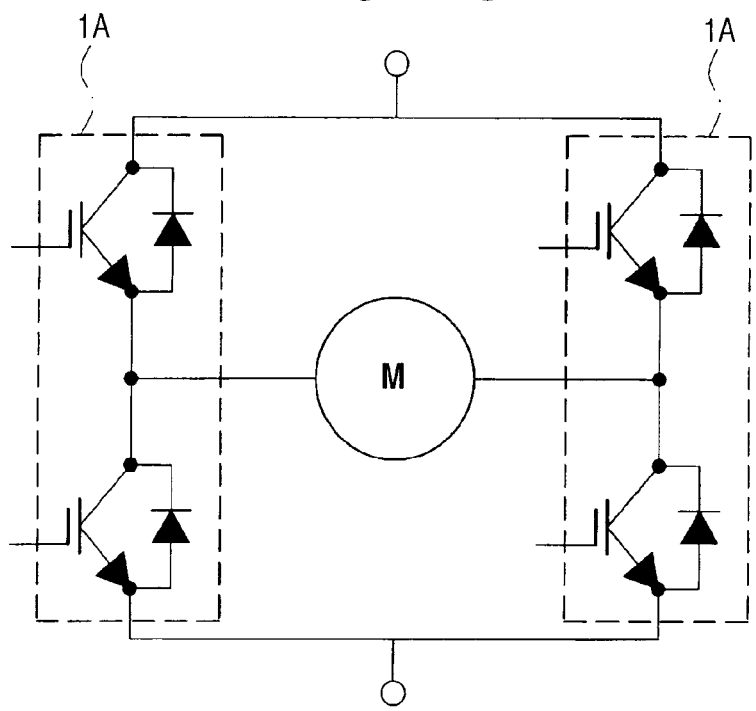
FIG. 23 shows an example of an H-bridge motor inverter circuit which uses the semiconductor package according to the first embodiment.

FIG. 22 shows an example of a three-phase motor inverter circuit which uses three switch modules, each of which is the semiconductor package 1A according to this embodiment. FIG. 23 shows an example of an H-bridge motor inverter circuit which uses two switch modules, each of which is the semiconductor package 1A according to this embodiment.

The switch module in this embodiment does not use a multi-layer wiring board or the like and instead, it adopts a thermal diffusion plate (header) as a single metal plate in which the semiconductor chips 5A and 5B, diode chips 8A and 8B are mounted over the upper surfaces of the die pads (TAB1, TAB2) and these chips and leads 3 are coupled by the Al wires 10 and 11 so that the switch module is implemented by a single semiconductor package 1A. Thus the switch module cost is reduced by using the metal thermal diffusion plate the material cost of which is lower than that of a multi-layer wiring board or the like. In addition, since the metal thermal diffusion plate has a high thermal conductivity, the heat generated by the semiconductor chips 5A and 5B can be directly diffused to the die pads (TAB1, TAB2), permitting the switch module to have good heat radiation characteristics.

In the switch module according to this embodiment, one end of the lead 3 adjacent to the die pad TAB1 is located in a higher position than the upper surface of the die pad TAB1 and one end of the lead 3 adjacent to the die pad TAB2 is located in a higher position than the upper surface of the die pad TAB2. Consequently, the length of the Al wire 10 for coupling the semiconductor chip 5A (5B) and the lead 3 can be shorter than when one end of the lead 3 is not located in a higher position than the upper surface of the die pad TAB1 (TAB2), so the parasitic inductance and resistance of the Al wire 10 can be decreased. This leads to improvement in the switch module performance. Furthermore, since the parasitic inductance and resistance are decreased, the possibility of semiconductor chip breakdown due to the reverse induction voltage at the start or stop of the motor can be suppressed. Therefore, the reliability of the power semiconductor module can be improved.

In addition, since the distance between the outermost peripheral area of the upper surface of the semiconductor chip 5A (5B) and the Al wire 10 is longer, a discharge between the semiconductor chip 5A (5B) and the Al wire 10 is unlikely to occur and the reliability of the switch module is thus improved.

Second Embodiment

Figure 24:
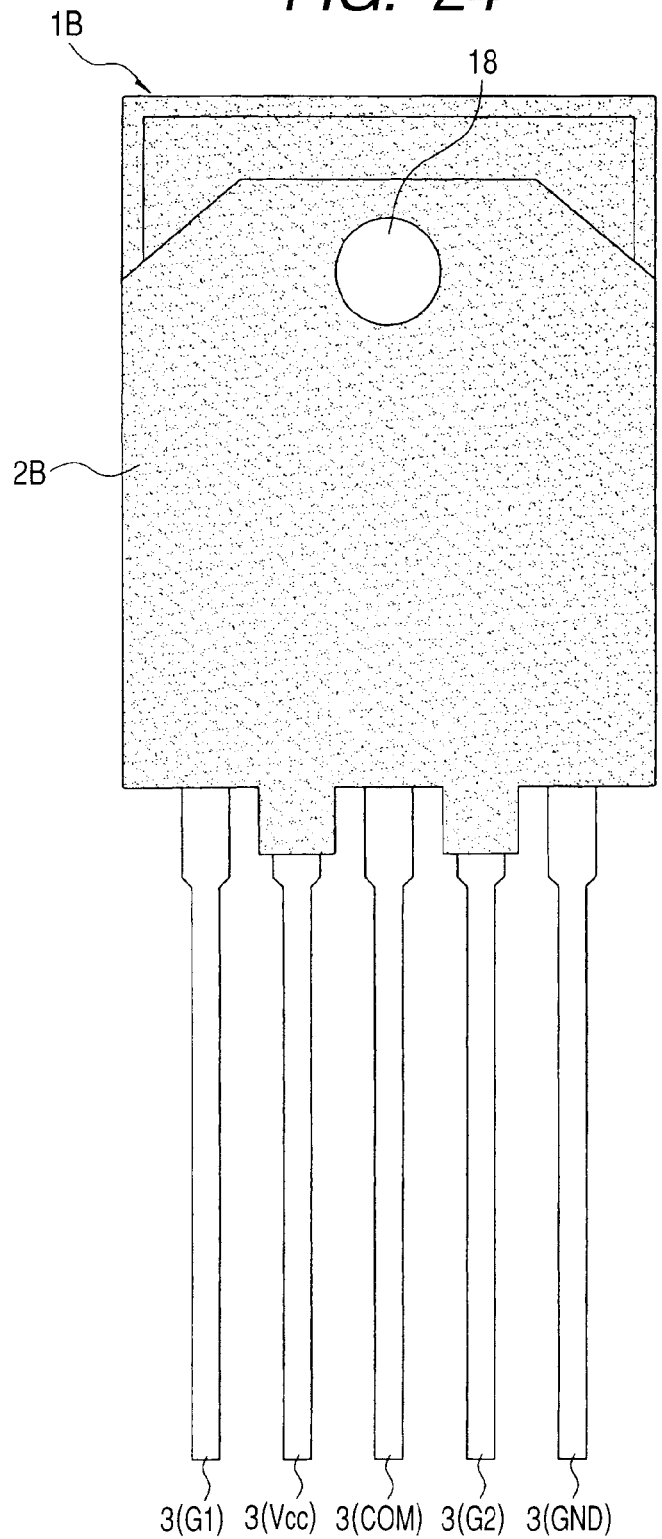
FIG. 24 is a plan view showing the external appearance of the semiconductor package according to a second embodiment of the invention.
Figure 25:
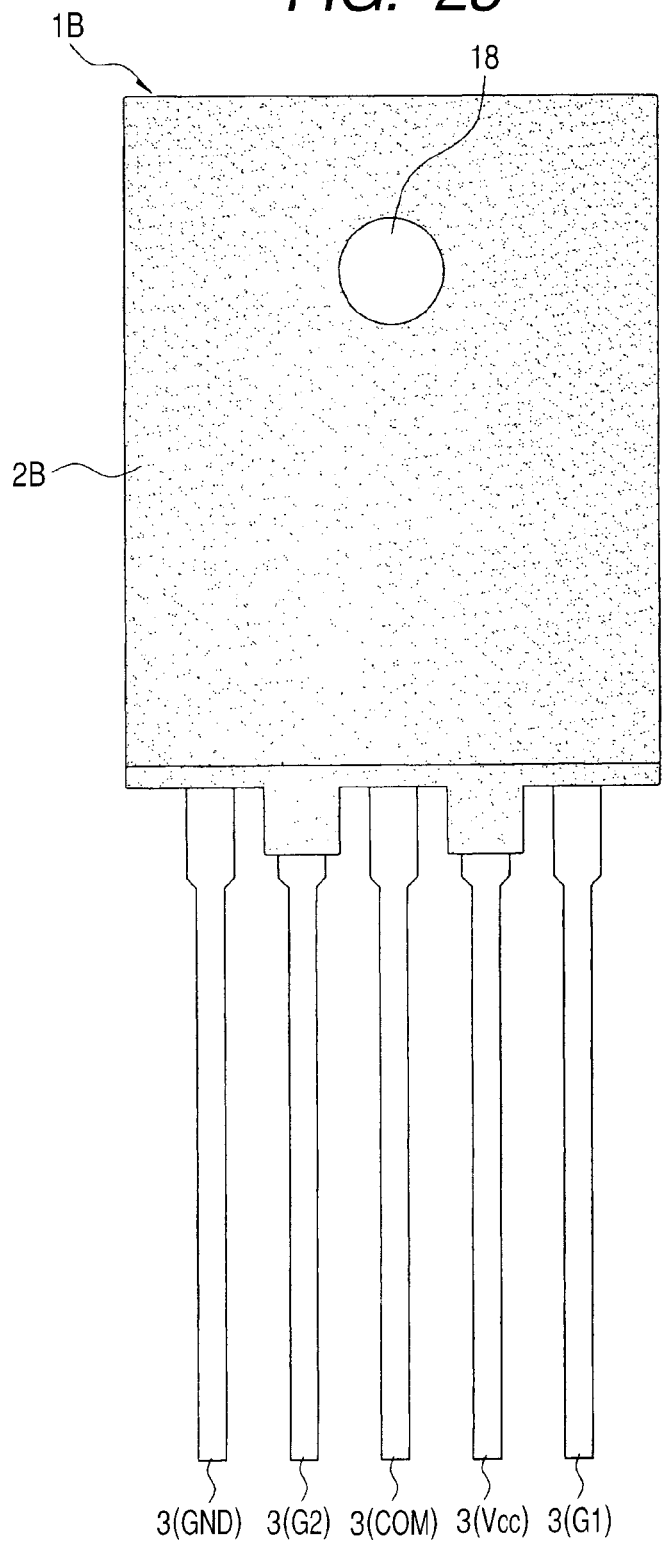
FIG. 25 is a plan view showing the heat radiating plate mounting side of the semiconductor package according to the second embodiment.
Figure 26:
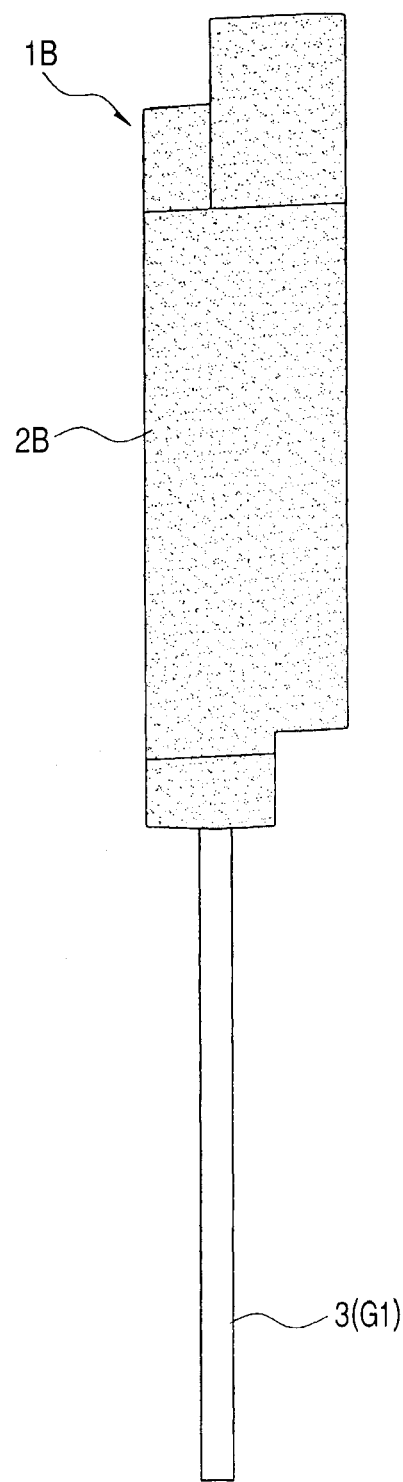
FIG. 26 is a side view of the semiconductor package according to the second embodiment.
Figure 27:
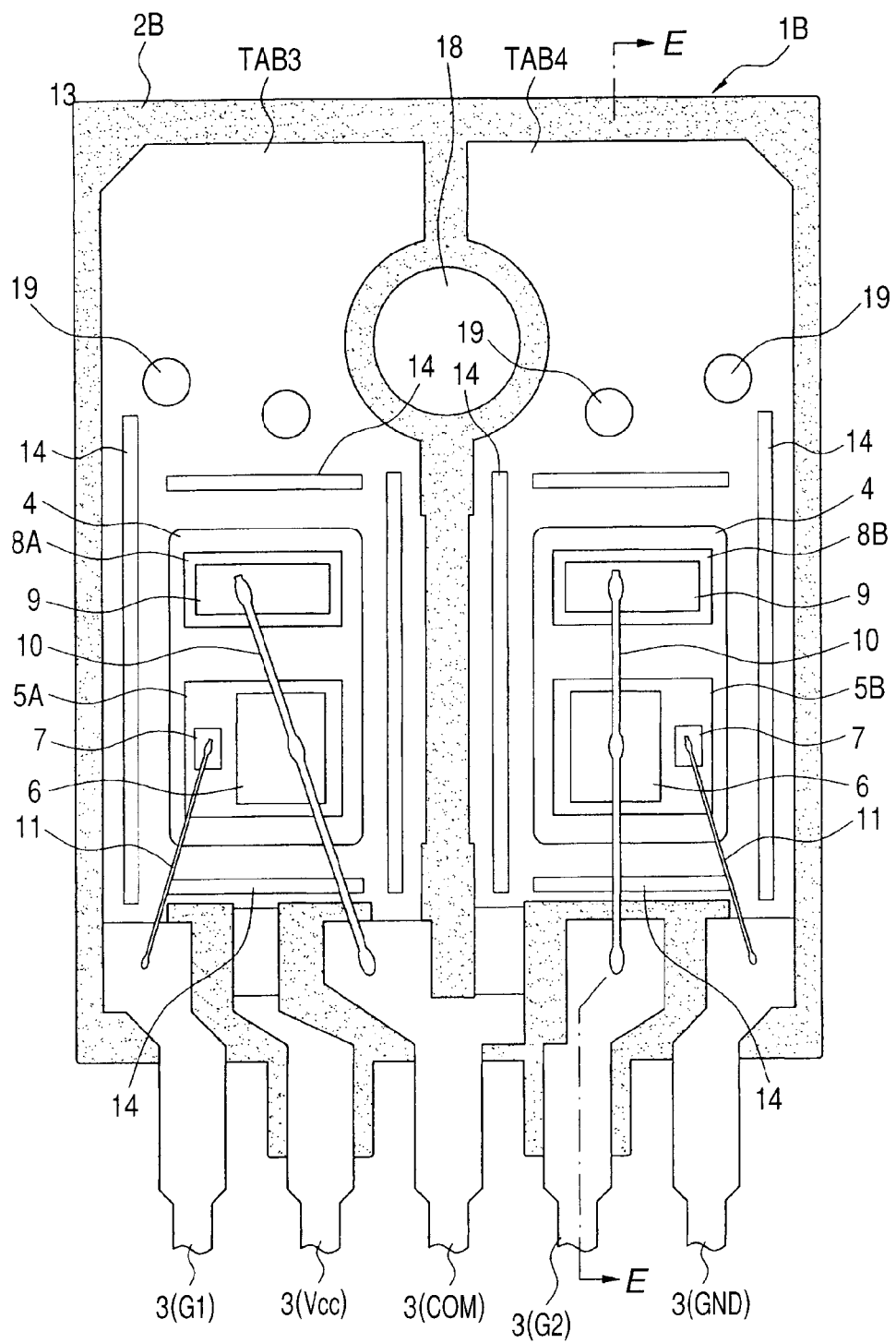
FIG. 27 is a plan view showing the internal structure of the semiconductor package according to the second embodiment.
Figure 28:
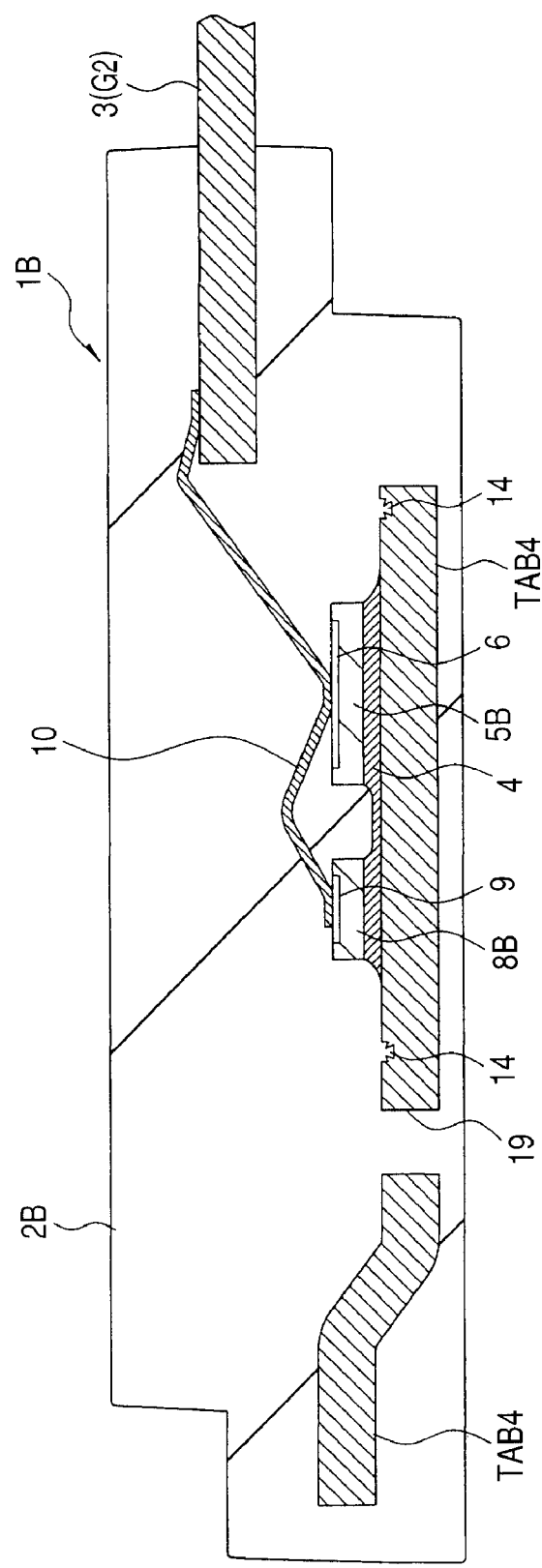
FIG. 28 is a sectional view taken along the line E-E in FIG. 27.

FIG. 24 is a plan view showing the external appearance of the semiconductor package according to the second embodiment; FIG. 25 is a plan view showing the back side of the semiconductor package (on which the heat radiating plate is mounted); FIG. 26 is a side view of the semiconductor package; FIG. 27 is a plan view showing the internal structure of the semiconductor package; and FIG. 28 is a sectional view taken along the line E-E in FIG. 27.

Whereas the lower surfaces of the die pads (TAB1, TAB2) are exposed from the lower surface of the sealing body 2B in the semiconductor package 1A according to the first embodiment, the die pads (TAB1, TAB2) are completely covered by the sealing body 2A in the semiconductor package 1B according to the second embodiment.

Five leads 3 protruding in parallel from one lateral side of the sealing body 2B correspond to the five terminals of the switch circuit shown in FIG. 1 as in the first embodiment. Namely, the five leads 3 are as follows: the lead 3 (Vcc) as a constituent of the terminal VCC, the lead 3 (GND) as a constituent of the terminal GND, the lead 3 (G1) as a constituent of the terminal G1, the lead 3 (G2) as a constituent of the terminal G2, and the lead 3 (COM) as a constituent of the terminal COM. Regarding the pair of die pads (TAB3, TAB4) sealed inside the sealing body 2B, the die pad TAB3 is integral with the lead 3 (Vcc) for the terminal Vcc and the die pad TAB4 is integral with the lead 3 (COM) for the terminal COM. The order in which the terminals are arranged is the same as in the semiconductor package according to the first embodiment.

In this embodiment, since the die pads (TAB3, TAB4) are completely covered by the sealing body 2B, the plate thickness of the die pads (TAB3, TAB4) is made larger than that of the die pads (TAB1, TAB2) to increase the heat capacity. The thickness of the die pads (TAB3, TAB4) and leads 3 is, for example, 0.9 mm.

A semiconductor chip 5A and a diode chip 8A are mounted over the upper surface of the die pad TAB 3 through a conductive adhesive 4 and a semiconductor chip 5B and a diode chip 8B are mounted over the upper surface of the die pad TAB4 through a conductive adhesive 4. The semiconductor chips 5A and 5B and the diode chips 8A and 8B are the same as used in the first embodiment.

Like the first embodiment, the anode pad 9 of the diode chip 8A, the emitter pad 6 of the semiconductor chip 5A, and the lead 3 (COM) are electrically coupled with each other by a single Al wire 10 and the gate pad 7 of the semiconductor chip 5A and the lead 3 (G1) are electrically coupled with each other by a single Al wire 11. Also, the anode pad 9 of the diode chip 8B, the emitter pad 6 of the semiconductor chip 5B, and the lead 3 (G2) are electrically coupled with each other by a single Al wire 10 and the gate pad 7 of the semiconductor chip 5B and the lead 3 (GND) are electrically coupled with each other by a single Al wire 11. The switch circuit as shown in FIG. 1 is thus implemented.

Figure 29:
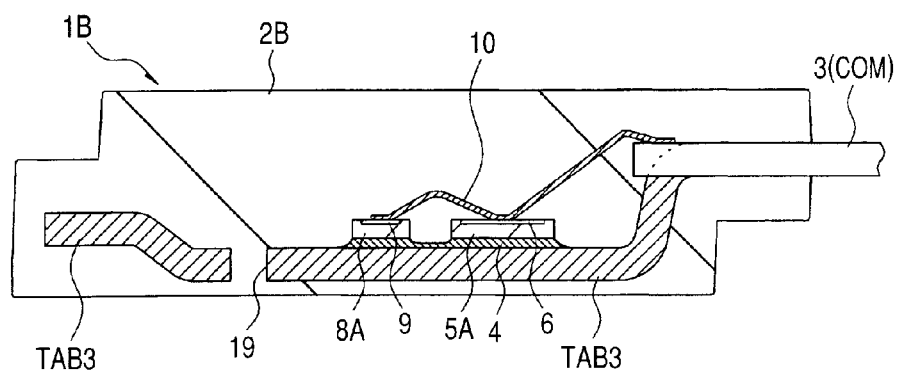
FIG. 29 is a schematic sectional view showing the positional relation between a die pad and a lead.
Figure 30:
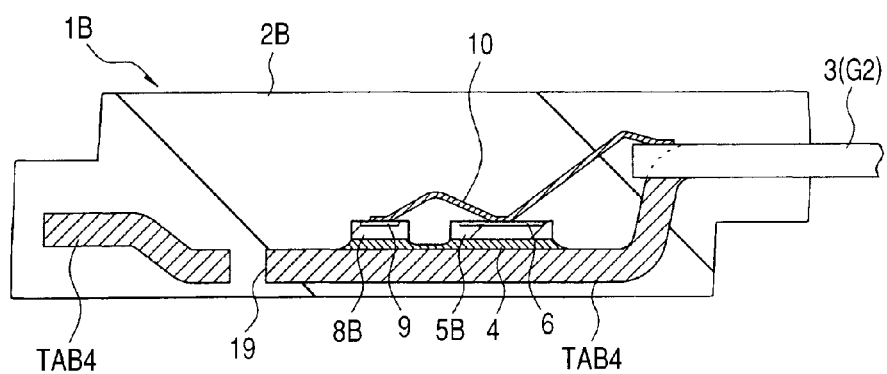
FIG. 30 is a schematic sectional view showing the positional relation between another die pad and another lead.

As illustrated in FIG. 29, one end of the lead 3 (COM) disposed adjacent to the die pad TAB3 is located in a higher position than the upper surface of the die pad TAB3. Also, as illustrated in FIG. 30, one end of the lead 3 (G2) disposed adjacent to the die pad TAB4 is located in a higher position than the upper surface of the die pad TAB4. Consequently, the same various advantageous effects as described above in connection with the first embodiment can be achieved.

The semiconductor package 1B in this embodiment has a circular through hole 18 in the center of the sealing body 2B which lies outside the semiconductor chips 5A and 5B. Like the through hole 12 in the semiconductor package 1A, this through hole 18 is a screw hole used to fix the semiconductor package 1A on a heat radiating plate.

Figure 31:
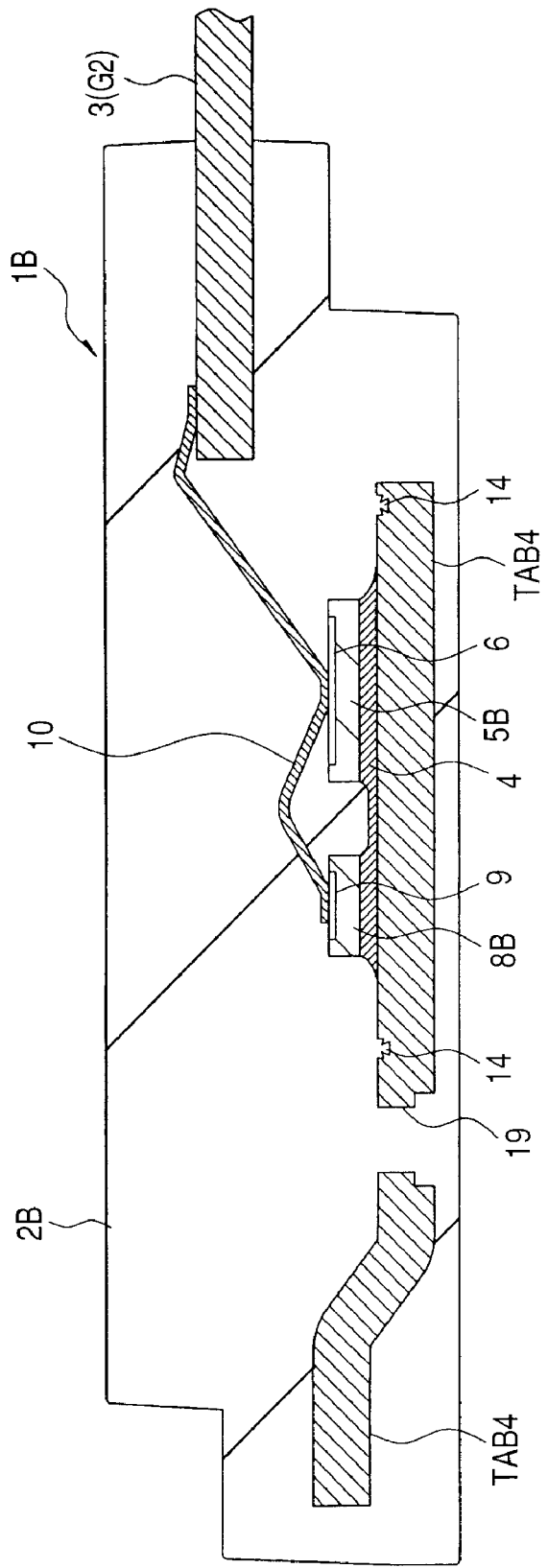
FIG. 31 is a sectional view showing another example of a through hole in a die pad.

In this embodiment, in order to prevent the interface between the resin (sealing body 2B) around the through hole 18 and the die pad (TAB3, TAB4) from peeling off due to the temperature cycle, the semiconductor package 1B has a plurality of through holes 19 with a diameter smaller than the through hole 18 in the die pad (TAB3, TAB4) areas around the through hole 18. Consequently, the resin on the upper surface of the die pad (TAB3, TAB4) is coupled with the resin on its lower surface through the through holes 19, so the strength of adhesion between the sealing body 2B and the die pad (TAB3, TAB4) is increased due to an anchor effect, thereby preventing the interface from peeling off. As for the diameter of each through hole 19, the diameter on the upper surface side of the die pad (TAB3, TAB4) may be the same as that on the lower surface side as illustrated in FIG. 28; however, it is also possible that the diameter on the upper surface side of the die pad (TAB3, TAB4) and that on the lower surface side are different as illustrated in FIG. 31. In the latter case, the strength of adhesion between the die pad (TAB3, TAB4) and the resin inside the through hole 19 is increased, so the possibility that the interface between the sealing body 2B and the die pad (TAB3, TAB4) may peel off can be more reduced.

Like the semiconductor chip 1A in the first embodiment, the semiconductor package 1B in this embodiment has grooves 14 for resin fixation in the die pad (TAB3, TAB4) around the area where the semiconductor chip (5A, 5B) and diode chip (8A, 8B) are mounted. The grooves 14 also have a function to prevent the conductive adhesive 4 from spreading outside the chip mounting area when mounting the semiconductor chip (5A, 5B) and diode chip (8A, 8B) on the die pad (TAB3, AB4).

Figure 32:
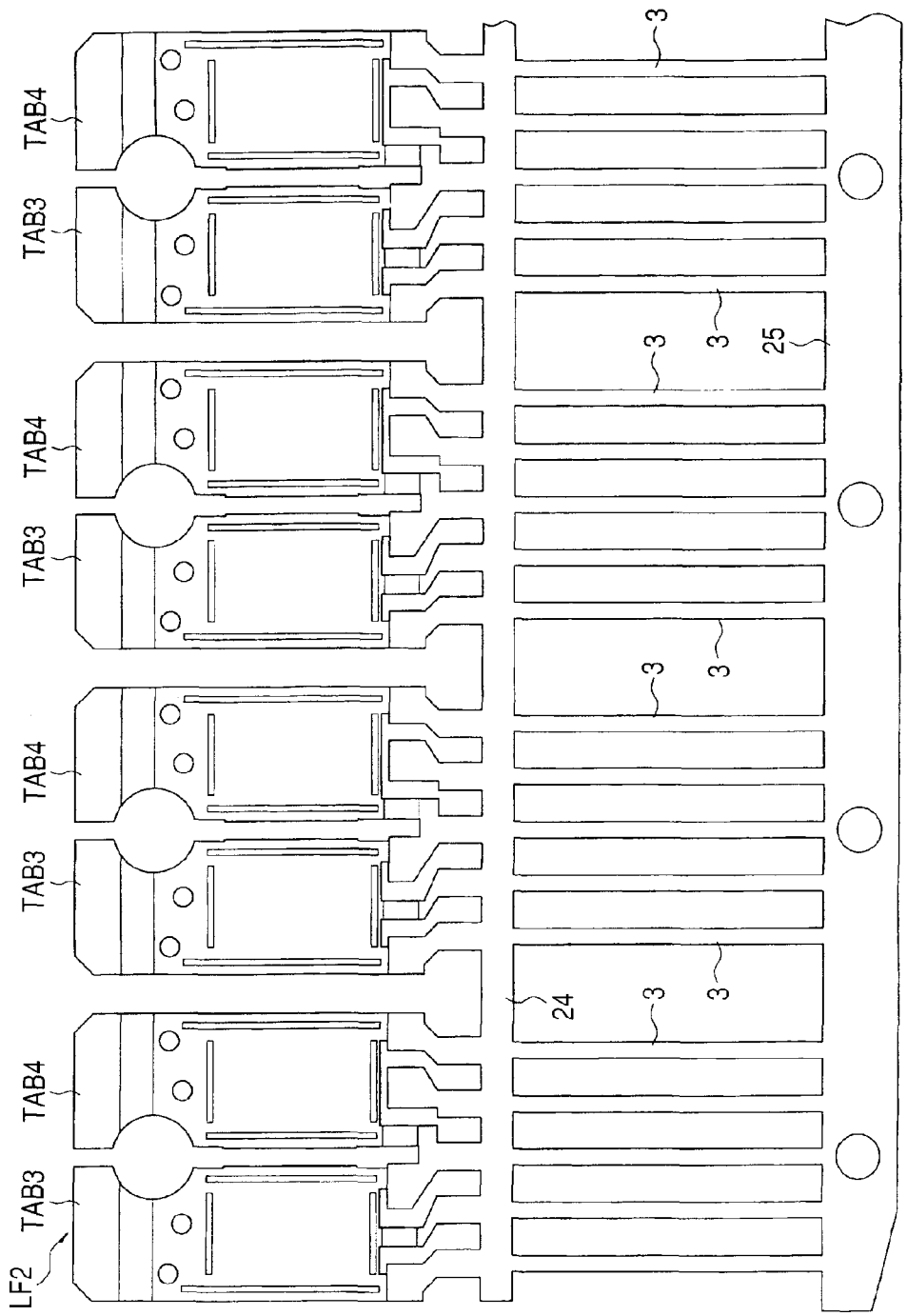
FIG. 32 is a plan view showing a step in the method for manufacturing the semiconductor package according to the second embodiment.

For assembly of the semiconductor package 1B in this embodiment, first, a lead frame LF2, in which die pads (TAB3, TAB4) for a plurality of packages are coupled by a tie bar 24 and a frame 25, is prepared as illustrated in FIG. 32.

Figure 33:
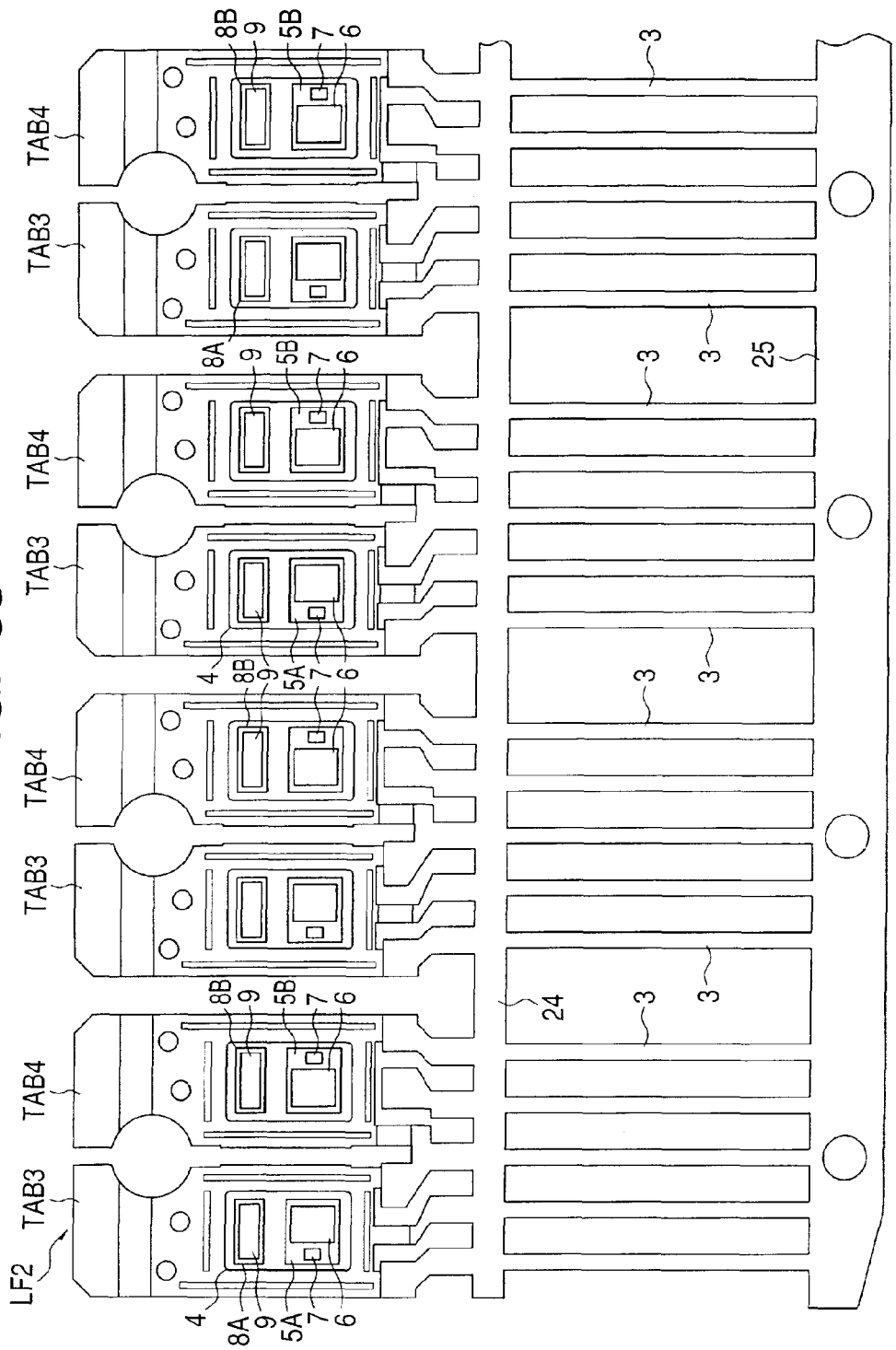
FIG. 33 is a plan view showing a semiconductor package manufacturing step subsequent to the step in FIG. 32.

Next, as illustrated in FIG. 33, a conductive adhesive 4 is supplied to the chip mounting areas of the die pads (TAB1 and TAB2) and then semiconductor chips 5A and 5B and diode chips 8A and 8B are mounted over them respectively.

Figure 34:
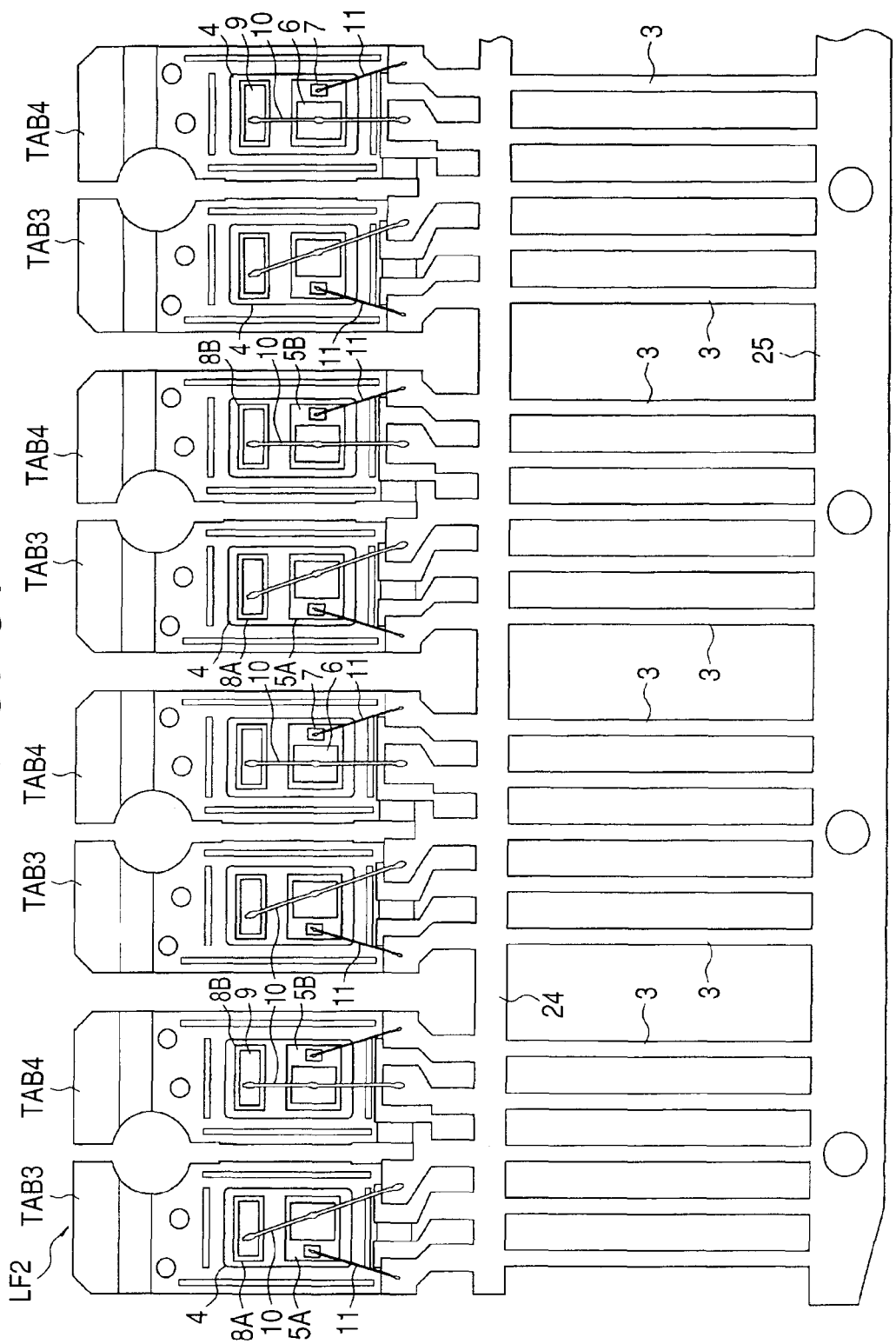
FIG. 34 is a plan view showing a semiconductor package manufacturing step subsequent to the step in FIG. 33.

Then, as illustrated in FIG. 34, the semiconductor chip 5A (5B), diode chip 8A (8B) and leads 3 are electrically coupled by Al wires 10 and 11. Coupling by the Al wires 10 and 11 are made by ultrasonic wedge bonding.

Figure 35:
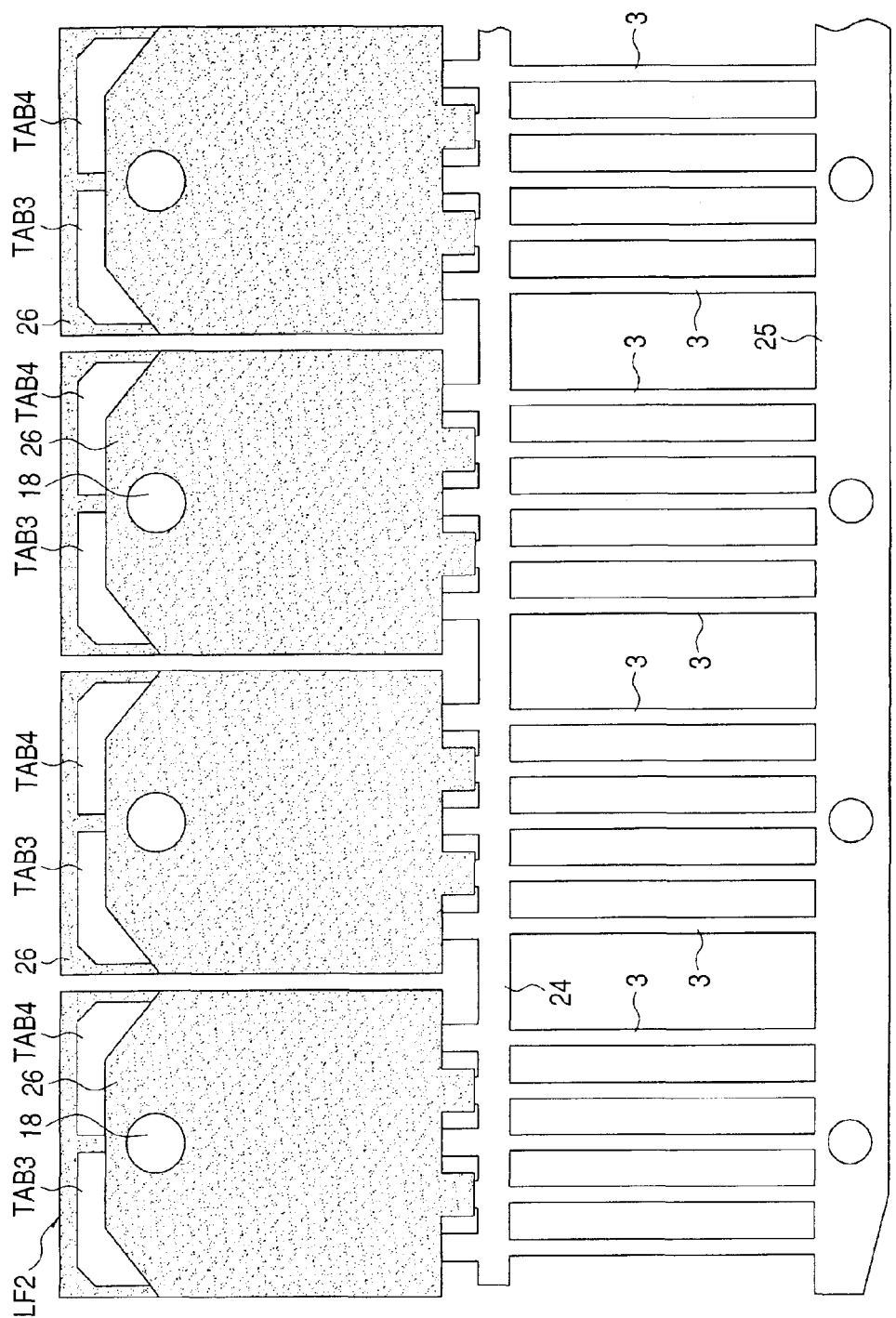
FIG. 35 is a plan view showing a semiconductor package manufacturing step subsequent to the step in FIG. 34.
Figure 36:
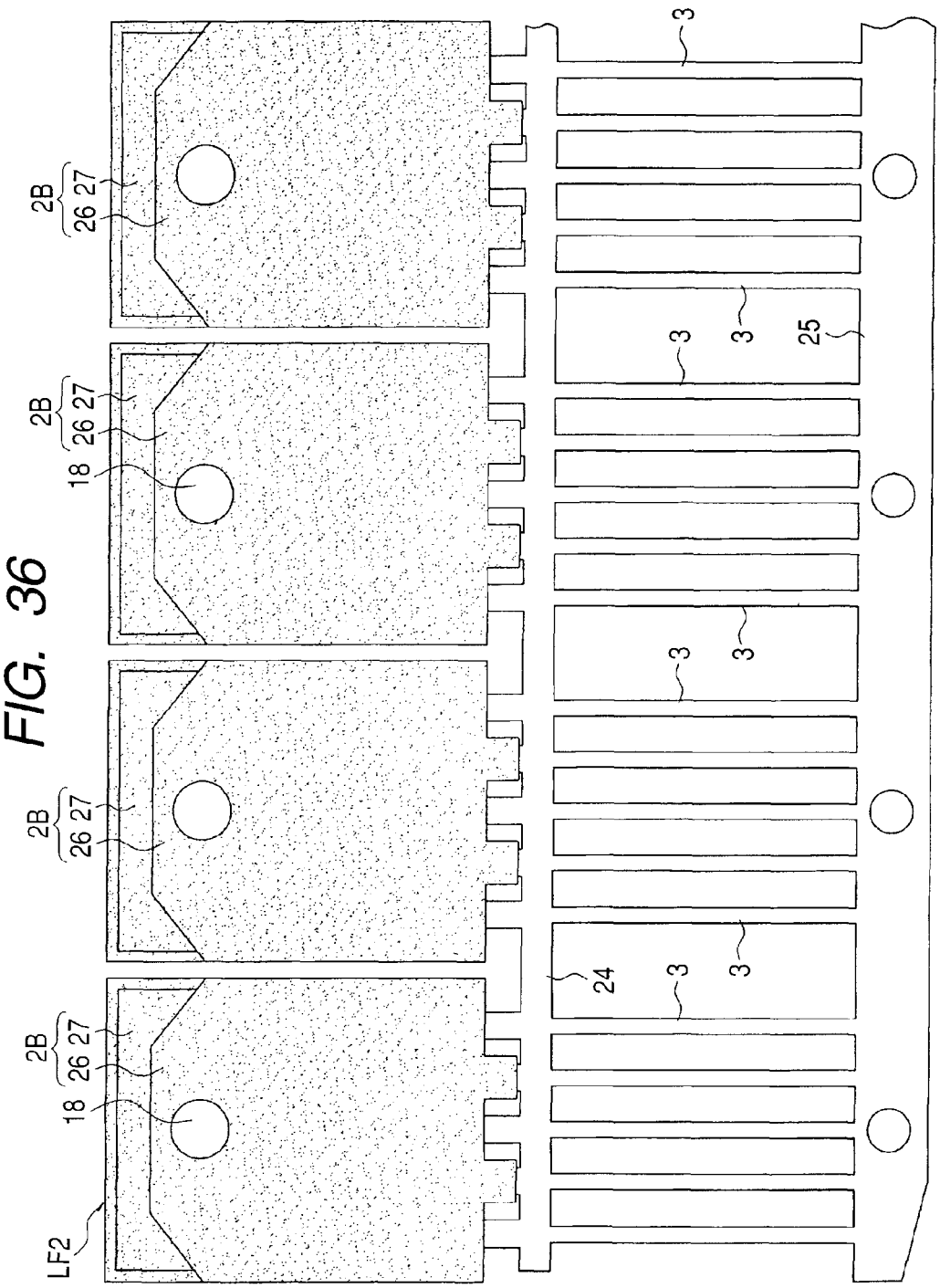
FIG. 36 is a plan view showing a semiconductor package manufacturing step subsequent to the step in FIG. 35.

Next, the lead frame LF2 is attached in a mold die (not shown) and as illustrated in FIG. 35, part of each die pad (TAB1, TAB2), the semiconductor chip (5A, 5B), diode chip (8A, 8B) and Al wires 10 and 11 are covered by mold resin 26, then as illustrated in FIG. 36, the die pads (TAB3, TAB4) areas exposed, or not covered by the mold resin 26, are covered by potting resin 27. Consequently the die pads (TAB3, TAB4), semiconductor chips 5A and 5B, diode chips 8A and 8B, and Al wires 10 and 11 are covered by the sealing body 2B which includes the mold resin 26 and potting resin 27.

Figure 37:
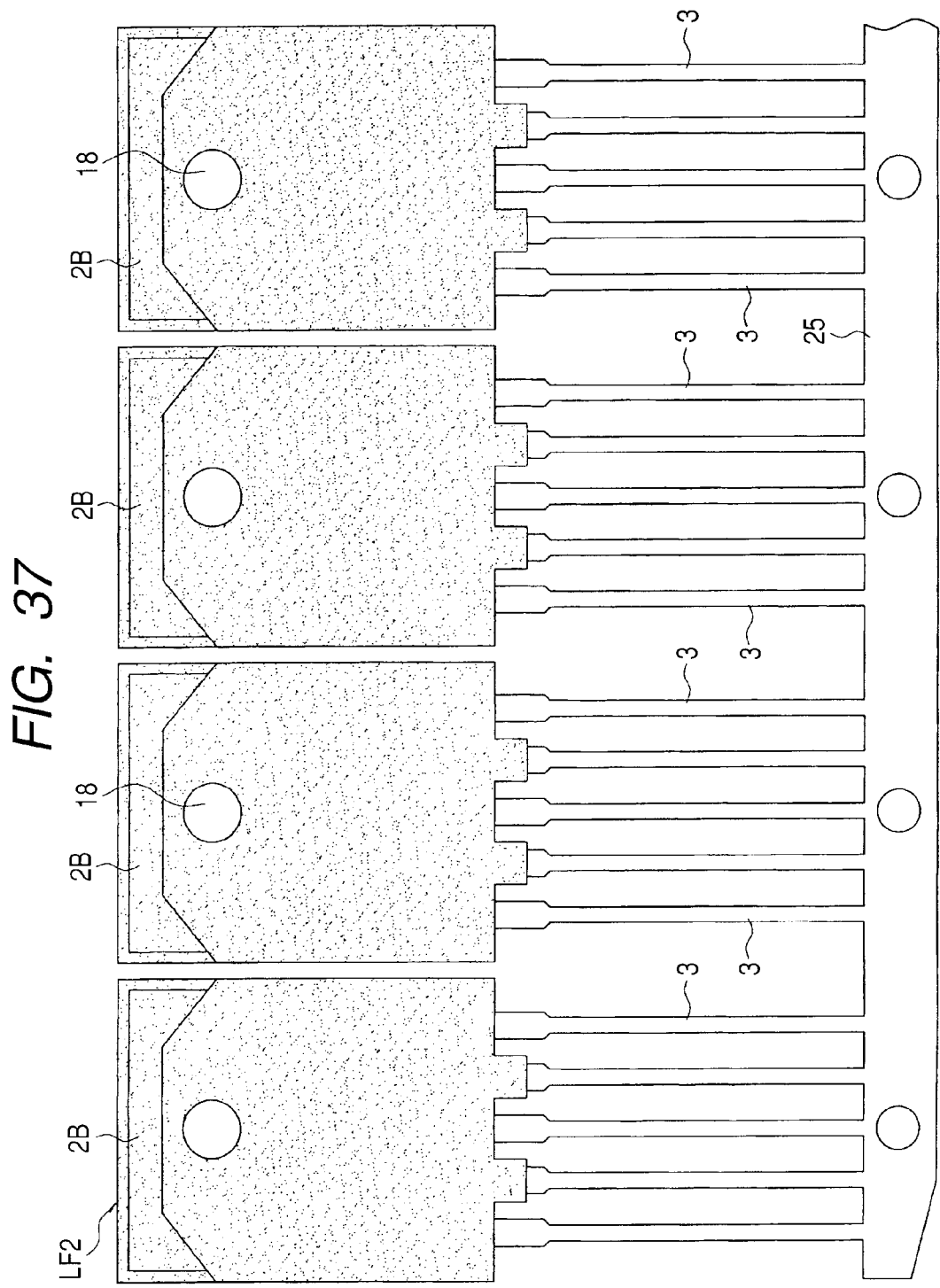
FIG. 37 is a plan view showing a semiconductor package manufacturing step subsequent to the step in FIG. 36.
Figure 38:
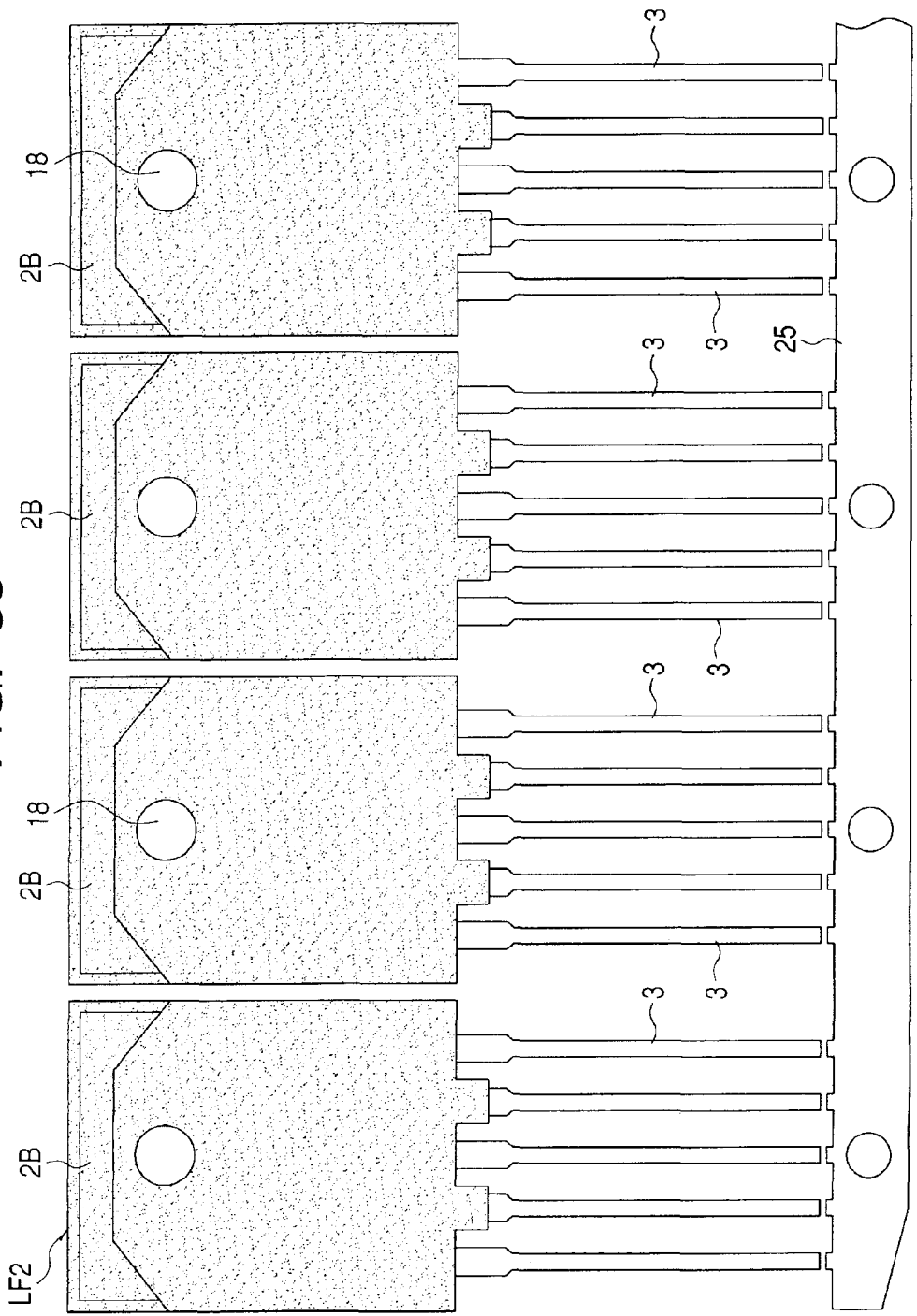
FIG. 38 is a plan view showing a semiconductor package manufacturing step subsequent to the step in FIG. 37.

Then, the tie bar 24 is cut and removed as illustrated in FIG. 37 and the surfaces of the leads 3 are coated (not shown), and unwanted parts of the lead frame LF2 are cut and removed as illustrated in FIG. 38 to complete the semiconductor package 1B according to the second embodiment as shown in FIGS. 24 to 28.

Figure 39:
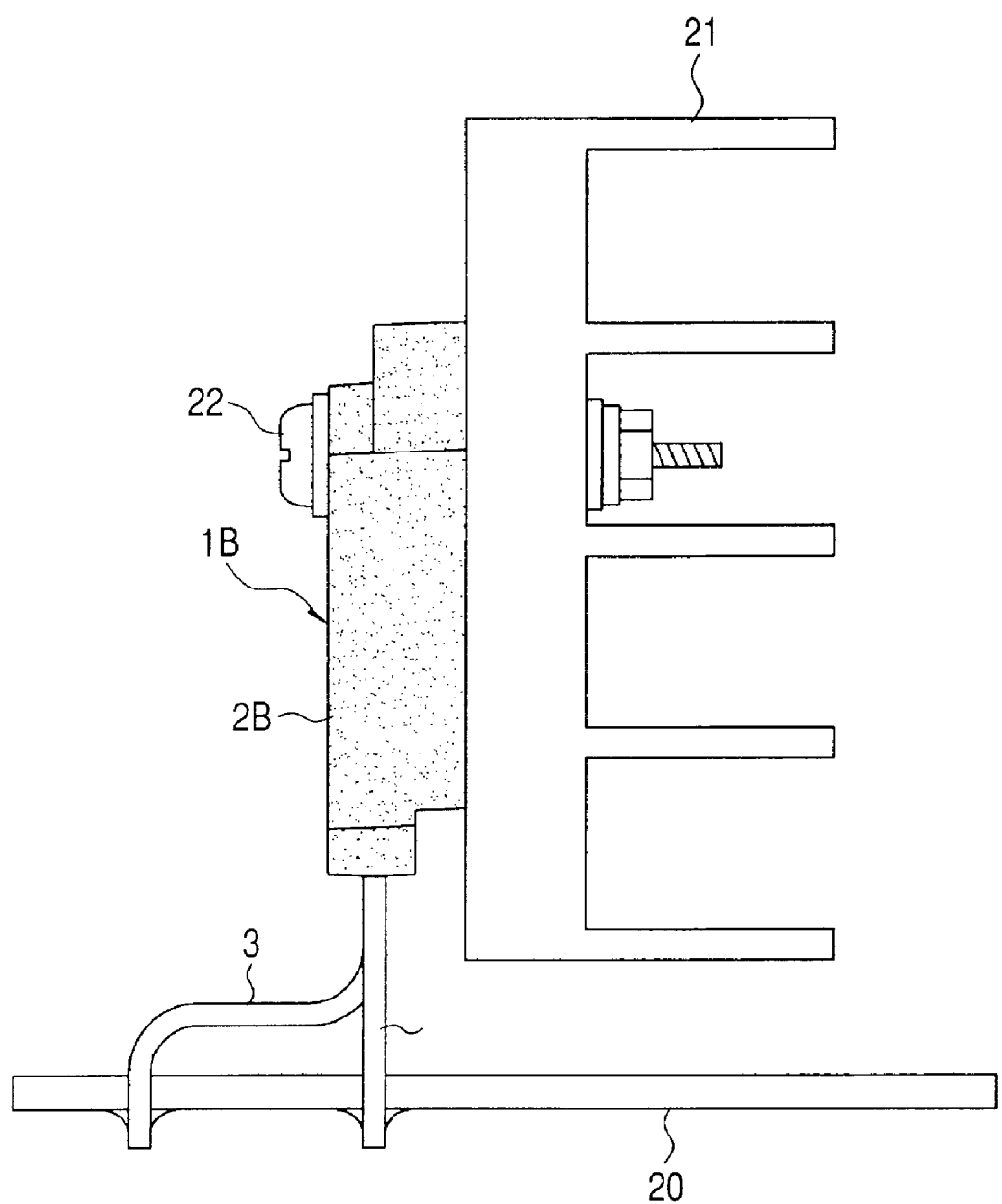
FIG. 39 is a side view showing the semiconductor package according to the second embodiment which is mounted on a wiring board.

FIG. 39 shows the semiconductor package 1B in this embodiment which is mounted on a motor wiring board 20. When mounting the semiconductor package 1B on the wiring board 20, the tips of the leads 3 are inserted in the wiring board 20 and fixed by soldering, as when mounting the semiconductor package 1A in the first embodiment. In this process, in order to prevent short-circuiting between the leads 3, the five leads 3 may be folded alternately before being inserted in the wiring board 20. If a heat radiating plate 21 of aluminum or similar material is to be attached to the backside of the semiconductor package 1B, a screw 22 is inserted into the through hole 18 in the sealing body 2B to fix the heat radiating plate 21.

Since the die pads (TAB3, TAB4) are not exposed outside the sealing body 2B in the semiconductor package 1B according to the second embodiment, unlike the semiconductor package 1A according to the first embodiment it is not necessary to interpose an insulating plate 23 between the semiconductor package 1B and the heat radiating plate 21. Therefore, the semiconductor package 1B can be attached to the heat radiating plate 21 more easily than the semiconductor package 1A. On the other hand, the semiconductor package 1A according to the first embodiment, in which the die pads (TAB1, TAB2) are exposed outside the sealing body 2A, is better in heat radiation characteristics than the semiconductor package 1B according to the second embodiment.

The invention made by the present inventors has been so far concretely explained in reference to the preferred embodiments thereof. However, the invention is not limited thereto and it is obvious that these details may be modified in various ways without departing from the spirit and scope thereof.

Figure 40:
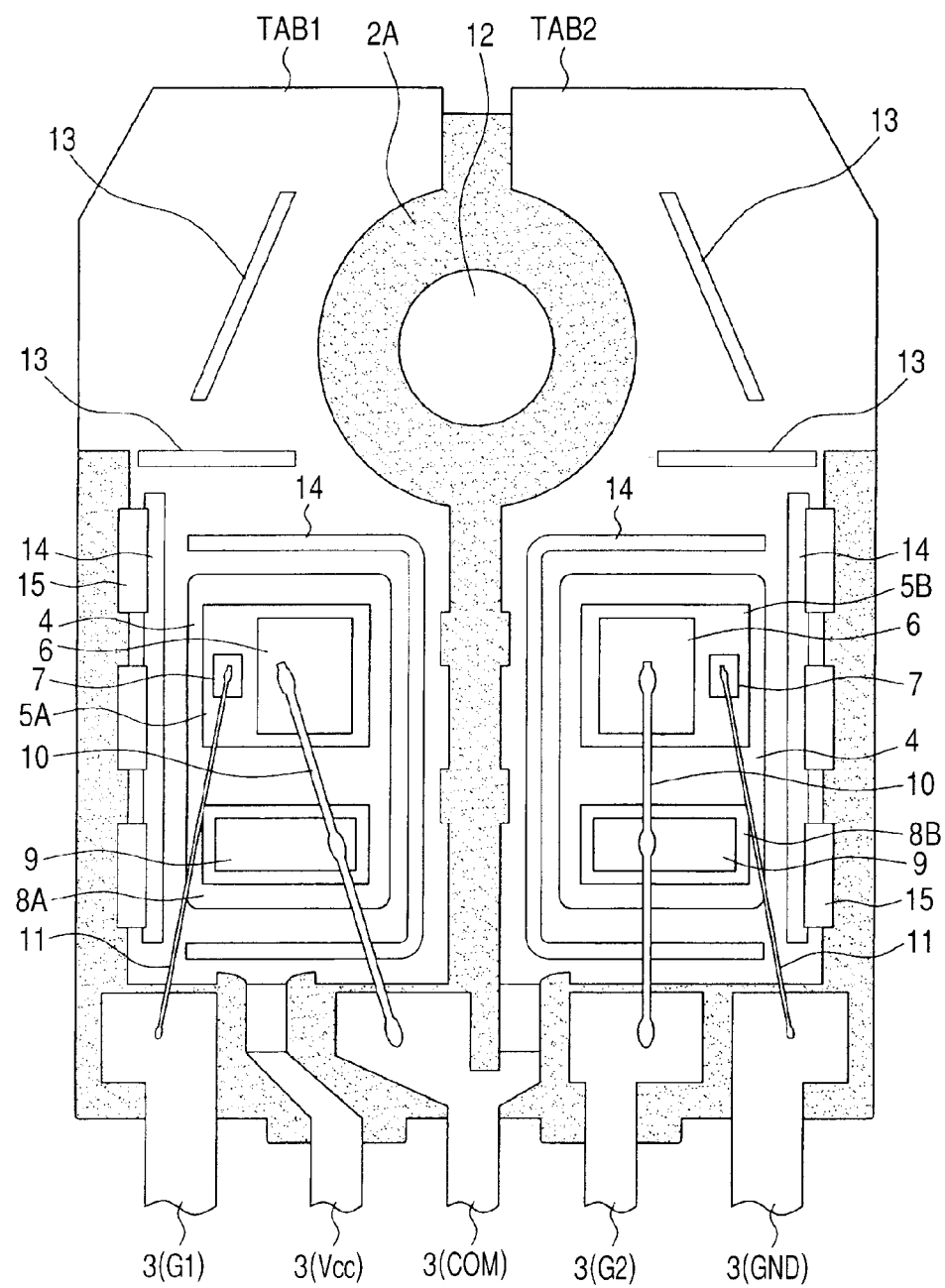
FIG. 40 is a plan view of a semiconductor package according to another embodiment of the invention.
Figure 41:
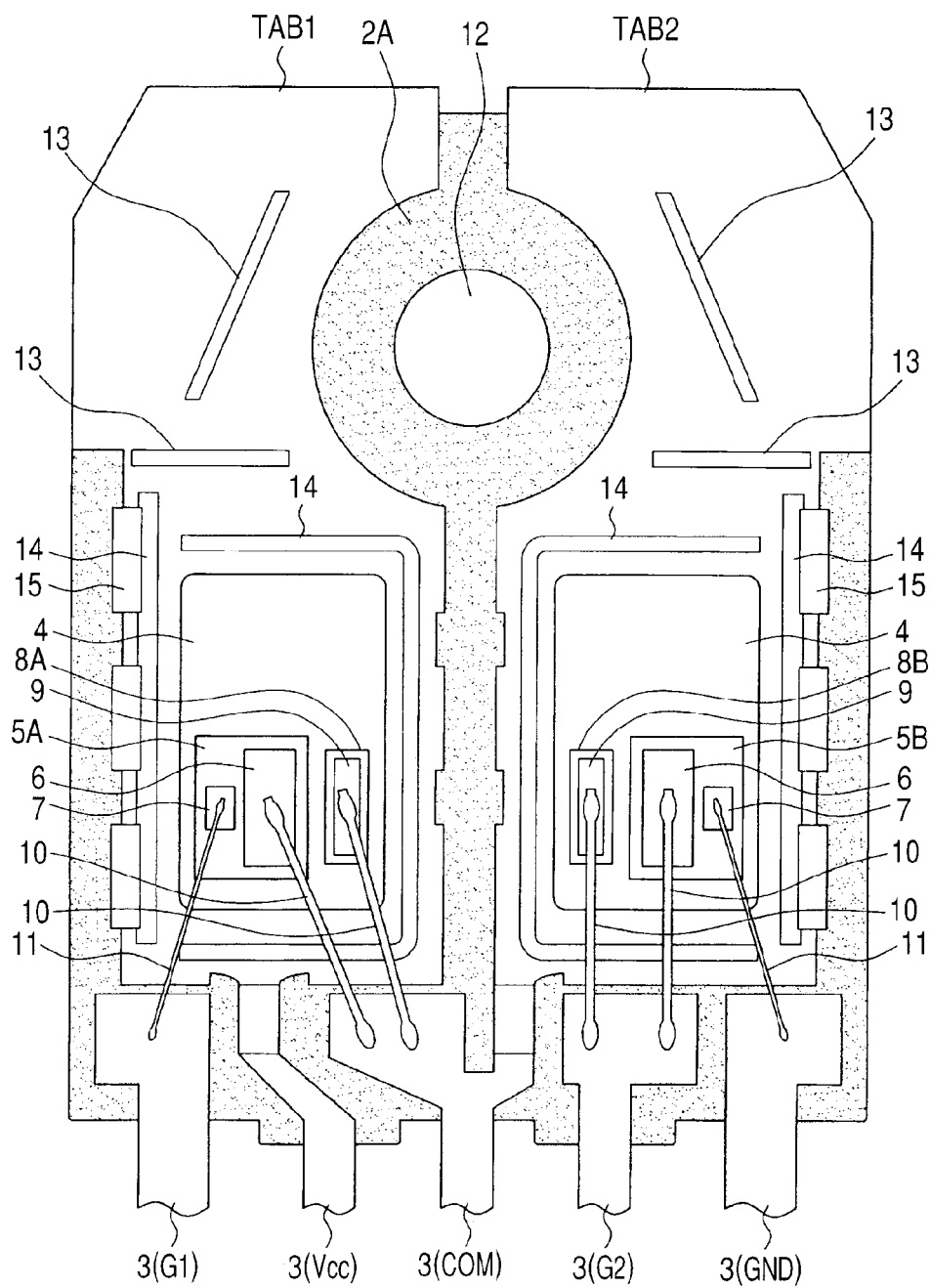
FIG. 41 is a plan view of a semiconductor package according to another embodiment of the invention.

For instance, the positions of the semiconductor chips 5A and 5B and those of the diode chips 8A and 8B can be changed. More specifically, in both the first and second embodiments, the semiconductor chips 5A and 5B are adjacent to the leads 3 and the diode chips 8A and 8B are relatively remote from the leads 3; however, it is also acceptable that as illustrated in FIG. 40, the diode chips 8A and 8B area adjacent to the leads 3 and the semiconductor chips 5A and 5B are relatively remote from the leads 3. In that case as well, the same advantageous effects as those described above in connection with the first and second embodiments can be achieved. If the semiconductor chips 5A and 5B and the diode chips 8A and 8B are small enough, the semiconductor chips 5A and 5B and the diode chips 8A and 8B may be arranged in parallel along the direction of arrangement of the leads 3 as illustrated in FIG. 41. In that case, though an Al wire 10 for coupling the emitter pad 9 of the semiconductor chip (5A, 5B) and a lead 3 and an Al wire 10 for coupling the anode pad 9 of the anode chip (8A, 8B) and a lead 3 are required, the Al wires can be shorter.

Figure 42:
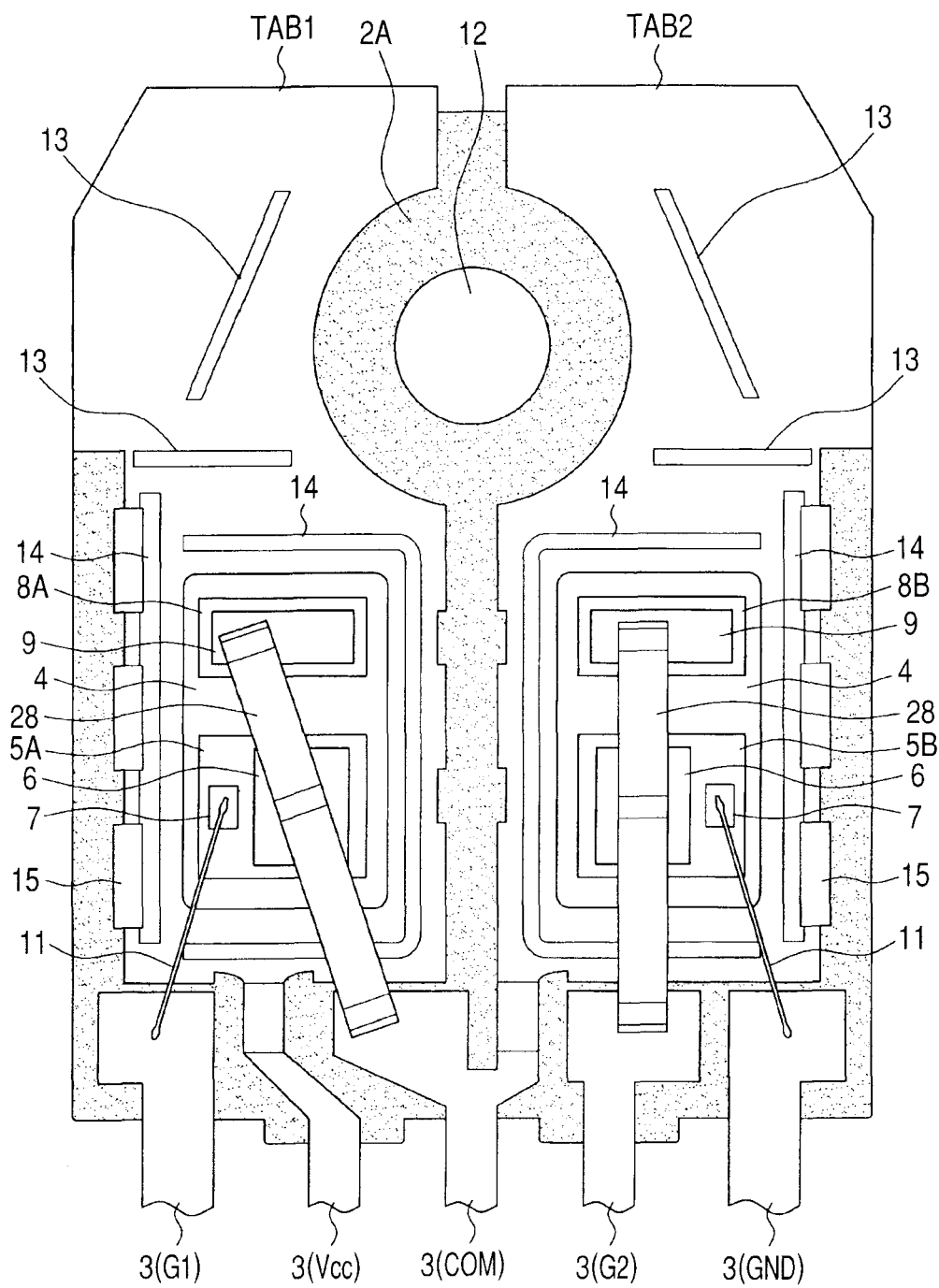
FIG. 42 is a plan view of a semiconductor package according to another embodiment of the invention.
Figure 43:
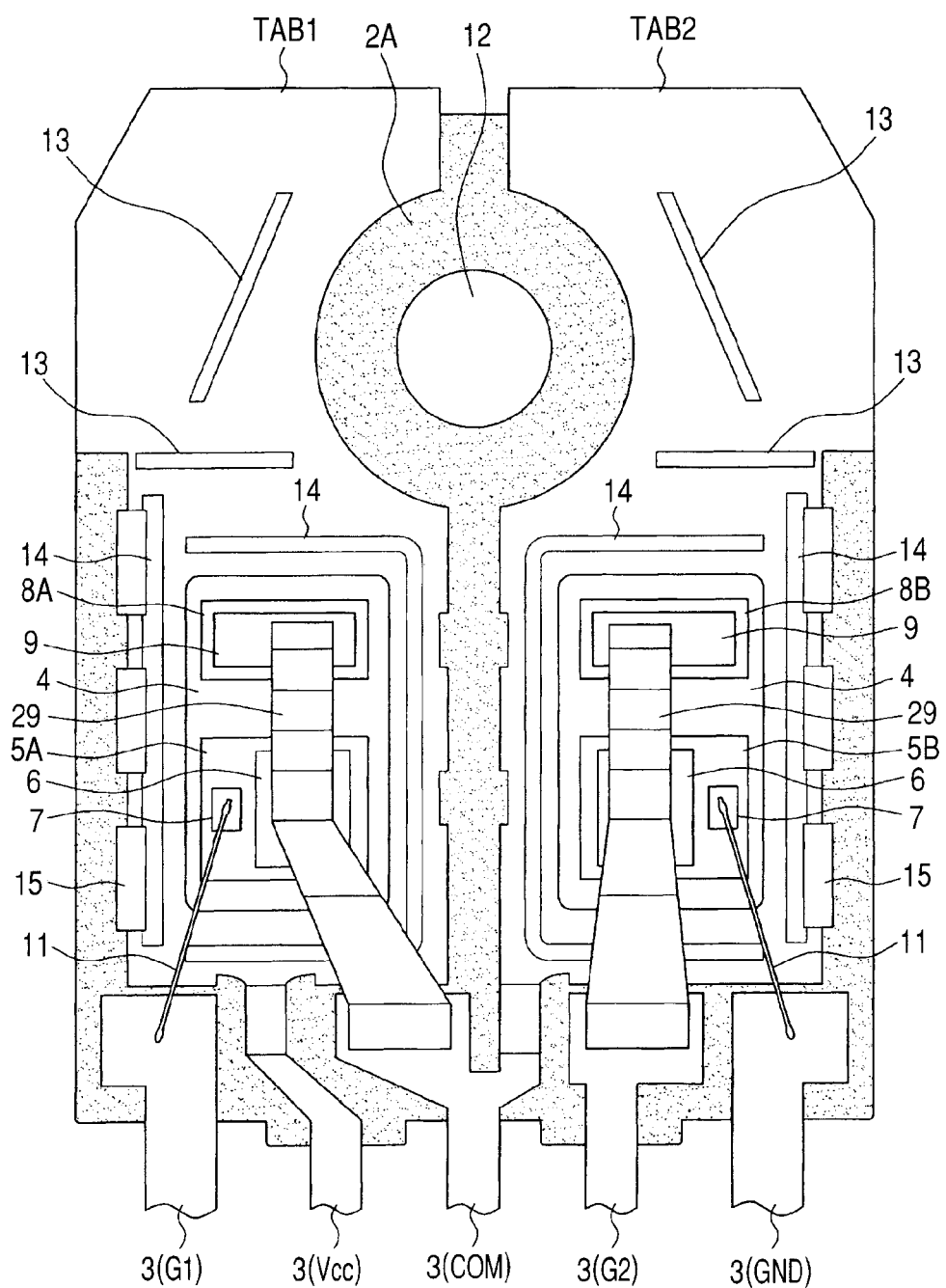
FIG. 43 is a plan view of a semiconductor package according to another embodiment of the invention.

Also, although the first and second embodiments use Al wires 10 with a larger diameter than Al wires 11 for coupling with the gate pads 7 as means for coupling the emitter pads 6 and anode pads 9 with the leads 3 in which a large current flows, Al ribbons 28 (conductive material) may be used instead of the Al wires 10 as illustrated in FIG. 42. Also Cu clips 29 (conductive material) may be used instead as illustrated in FIG. 43. Here, the Al ribbon means a band-like coupling member of aluminum-based conductive material. Since the Al ribbon is very thin, its length and loop form can be freely determined for coupling with the leads and semiconductor chip pads. The Cu clip is a band-like coupling member previously shaped into a desired form.

The use of Al ribbons or Cu clips reduces the on-resistance of the IGBT because they are larger in terms of width and thus larger in terms of sectional area than Al wires.

When Al ribbons or Cu clips are used as means for coupling the emitter pad 6 and anode pad 9 with the leads 3, if an Au wire is used as means for coupling the gate pad 7 with the lead 3, the on-resistance of the IGBT may be further decreased. Since it is easier to make a thin Au wire than a thin Al wire, it is possible to use an Au wire whose diameter is smaller than that of the Al wire. Therefore, the area of the gate pad 7 to be coupled by the Au wire can be decreased and the area of the emitter pad 6 can be increased by just that much. This means that a wider Al ribbon or Cu clip can be coupled with the emitter pad 6 to decrease the on-resistance of the IGBT further.

Furthermore, although the first and second embodiments use an IGBT as a semiconductor switch for a switch circuit, another type of transistor such as a MOSFET may be used instead of the IGBT. If a MOSFET is used, the drain electrode corresponds to the collector electrode and the source electrode corresponds to the emitter electrode. The MOSFET here may be an n-channel MOSFET or a p-channel MOSFET.

Figure 44A:
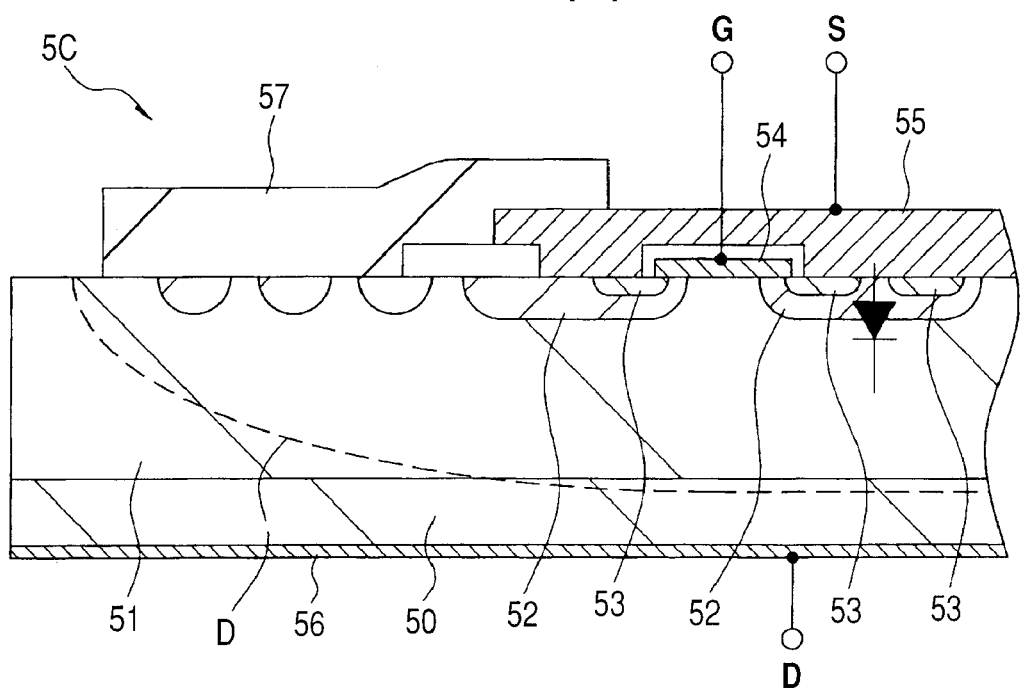
FIG. 44(a) is a fragmentary sectional view of a semiconductor chip in which a MOSFET is formed and FIG. 44(b) is an equivalent circuit diagram for the MOSFET.
Figure 44B:
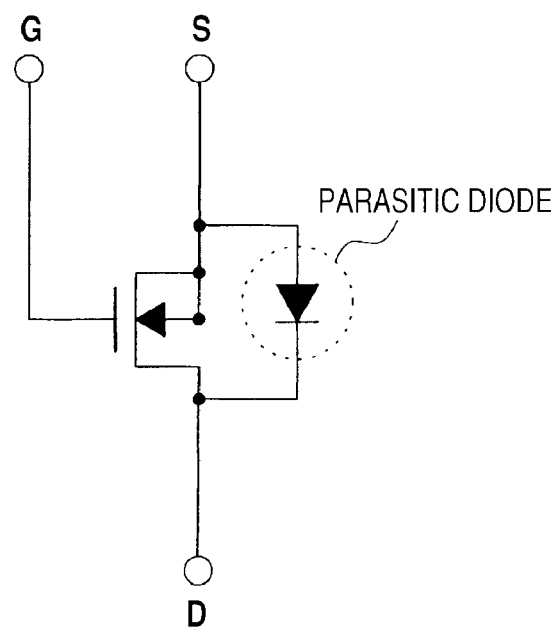

FIG. 44($a$) is a fragmentary sectional view of a semiconductor chip 5C in which a MOSFET is formed and FIG. 44($b$) is an equivalent circuit diagram for the MOSFET. FIG. 44($a$) shows an example of a planar n-channel MOSFET.

An $n^-$ epitaxial layer 51 is formed over an $n^+$ silicon substrate 50 and a $p^+$ diffusion layer 52 and an $n^+$ diffusion layer 53 are formed over the surface of the $n^-$ epitaxial layer 51. A gate electrode 54 as a polycrystalline silicon film or the like is formed over the $p^+$ diffusion layer 52 and the $n^+$ diffusion layer 53 and a source electrode 55 is formed over the gate electrode 54. In this MOSFET, the $n^+$ silicon substrate 50 and $n^-$ epitaxial layer 51 make up a drain and a drain electrode 56 is formed over the back side of the $n^+$ silicon substrate 50.

A surface protective film 57 covering the top surface of the $n^+$ silicon substrate 50 is formed over the source electrode 55. The source electrode 55 is an Al alloy film and the surface protective film 57 is a polyimide resin film. The area of the source electrode 55 which is not covered by the surface protective film 57, namely the exposed surface area of the semiconductor chip 5C, configures a source pad.

In the case of a MOSFET as well, when it is held at the reverse voltage, the outermost peripheral area of the semiconductor chip 5C lying outside the depletion layer (D) has the same potential as the back electrode (drain electrode 56) and a high voltage of several hundred volts is applied. Therefore, even when a MOSFET is used as a semiconductor switch for the switch circuit, the distance between the outermost peripheral area of the semiconductor chip 5C and the Al wire should be long enough.

Figure 45:
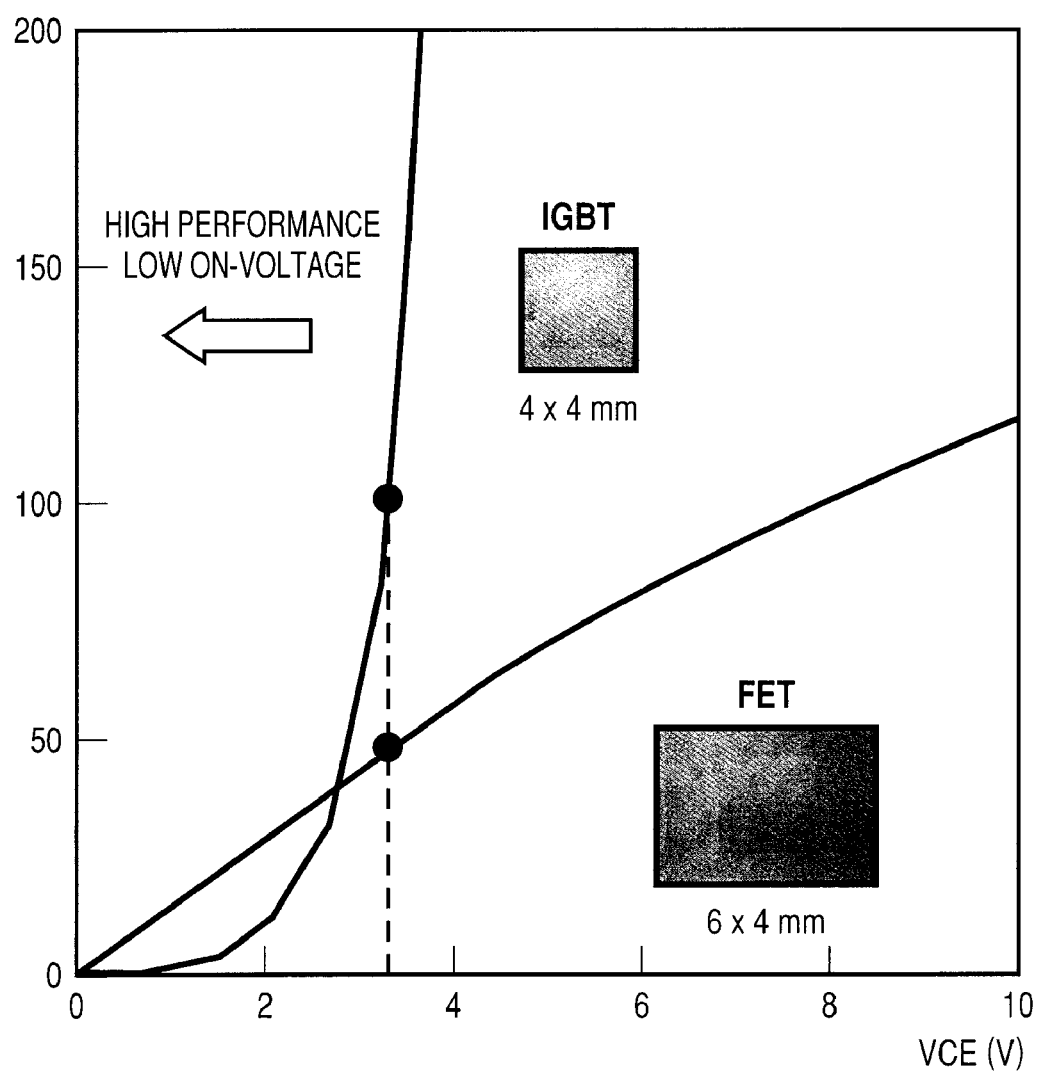
FIG. 45 is a graph which compares on-voltage characteristics between an IGBT and an FET.

FIG. 45 is a graph which compares IGBT with FET in on-voltage characteristics. This graph shows on-voltage characteristics provided that the on-voltage is 300 V.

In an IGBT, the p-n junction between the $p^+$ substrate and the $n^+$ layer above it must be forwardly biased and in the small-current zone, the on-voltage is higher than in an FET. However, in the large-current zone, the current can be controlled due to the low on-voltage since the chip size is smaller than the FET chip.

On the other hand, in a FET which uses an $n^+$ substrate, a parasitic diode is formed inside the chip as illustrated in FIGS. 44($a$) and 44($b$), an additional diode is not necessary. Conversely, in an IGBT which uses a $p^+$ substrate, a parasitic diode is not formed inside the chip and an additional diode chip is necessary.

The first and second embodiments concern switch modules to which the present invention is applied. However, the invention can be applied to various power semiconductor modules which combine a plurality of power semiconductor chips.

The present invention can be applied to power semiconductor modules which combine a plurality of power semiconductor chips.

What is claimed is:

1. A semiconductor device comprising:
   a sealing body made of insulating resin;
   a first metal base plate and a second metal base plate being at least partially covered by the sealing body and each forming a first electrode;
   a first semiconductor chip having a first electrode over its lower surface and a second electrode pad and a control electrode pad over its upper surface with the lower surface fixed over an upper surface of the first metal base plate through a conductive adhesive;
   a second semiconductor chip having a first electrode over its lower surface and a second electrode pad and a control electrode pad over its upper surface with the lower surface fixed over an upper surface of the second metal base plate through a conductive adhesive;

a first lead and a second lead each having one end covered by the sealing body and the other end protruding from one lateral side of the sealing body;

a first conductive material electrically coupling the second electrode pad of the first semiconductor chip and the one end of the first lead; and a second conductive material electrically coupling the second electrode pad of the second semiconductor chip and the one end of the second lead, wherein the one end of the first lead is located in a higher position than the upper surface of the first metal base plate, and wherein the one end of the second lead is located in a higher position than the upper surface of the second metal base plate.

2. The semiconductor device according claim 1, further comprising:

a third lead and a fourth lead each having one end covered by the sealing body and the other end protruding from one lateral side of the sealing body;

a third conductive material electrically coupling the control electrode pad of the first semiconductor chip and the one end of the third lead; and a fourth conductive material electrically coupling the control electrode pad of the second semiconductor chip and the one end of the fourth lead.

3. The semiconductor device according to claim 2, wherein the first, second, third, and fourth conductive materials are metal wires, and wherein a diameter of the first and second conductive materials is larger than a diameter of the third and fourth conductive materials.

4. The semiconductor device according to claim 3, wherein the metal wires are Al wires.

5. The semiconductor device according to claim 4, wherein the lower surfaces of the first and second metal base plates are each exposed from a lower surface of the sealing body.

6. The semiconductor device according to claim 5, wherein a through hole penetrating the upper and lower surfaces of the sealing body is provided in part of the sealing body, and wherein grooves for resin fixation are provided around the through hole in the first and second metal base plates.

7. The semiconductor device according to claim 6, wherein each end of each of the first and second metal base plates has a thin portion with a smaller thickness than other portions of the first and second metal base plates.

8. The semiconductor device according to claim 7, wherein an IGBT is formed in the first and second semiconductor chips.

9. A semiconductor device comprising:

a sealing body made of insulating resin;

a first metal base plate and a second metal base plate being at least partially covered by the sealing body and each forming a first electrode;

a first semiconductor chip having a first electrode over its lower surface and a second electrode pad and a control electrode pad over its upper surface with the lower surface fixed over an upper surface of the first metal base plate through a conductive adhesive;

a second semiconductor chip having a first electrode over its lower surface and a second electrode pad and a control electrode pad over its upper surface with the lower surface fixed over an upper surface of the second metal base plate through a conductive adhesive;

a first diode chip having a first electrode over its lower surface and a third electrode pad over its upper surface, with the lower surface fixed over the upper surface of the first metal base plate through a conductive adhesive, and being coupled in parallel with the first semiconductor chip;

a second diode chip having a first electrode over its lower surface and a third electrode pad over its upper surface, with the lower surface fixed over the upper surface of the second metal base plate through a conductive adhesive, and being coupled in parallel with the second semiconductor chip;

a first lead and a second lead each having one end covered by the sealing body and the other end protruding from one lateral side of the sealing body;

a first conductive material electrically coupling the second electrode pad of the first semiconductor chip and the one end of the first lead; and a second conductive material electrically coupling the second electrode pad of the second semiconductor chip and the one end of the second lead, wherein the one end of the first lead is located in a higher position than the upper surface of the first metal base plate, and wherein the one end of the second lead is located in a higher position than the upper surface of the second metal base plate.

10. The semiconductor device according to claim 9, wherein an IGBT is formed in the first and second semiconductor chips.

11. The semiconductor device according to claim 2, wherein the first and second conductive materials are metal ribbons or metal clips, and wherein the third and fourth conductive materials are metal wires.

12. The semiconductor device according to claim 11, wherein the metal wires are Au wires.

13. The semiconductor device according to claim 1, wherein a through hole penetrating the upper and lower surfaces of the sealing body is provided in part of the sealing body, and wherein a plurality of through holes with a smaller diameter than the through hole are provided around the through hole in the first and second metal base plates.

* * * * *